(12) United States Patent
Yamazaki et al.

(10) Patent No.: US 6,246,070 B1
(45) Date of Patent: Jun. 12, 2001

(54) SEMICONDUCTOR DEVICE PROVIDED WITH SEMICONDUCTOR CIRCUIT MADE OF SEMICONDUCTOR ELEMENT AND METHOD OF FABRICATING THE SAME

(75) Inventors: Shunpei Yamazaki, Tokyo; Setsuo Nakajima; Ritsuko Kawasaki, both of Kanagawa, all of (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 09/378,152

(22) Filed: Aug. 20, 1999

(30) Foreign Application Priority Data

Aug. 21, 1998 (JP) .................................................. 10-236021
Sep. 1, 1998 (JP) .................................................. 10-247643

(51) Int. Cl.[7] .................................................. H01L 29/72
(52) U.S. Cl. .................................. 257/40; 257/49; 257/59; 257/84; 257/347; 257/635; 257/642; 257/643; 438/149; 438/166; 438/587; 438/703; 438/763; 438/780
(58) Field of Search .................................. 257/40, 49, 59, 257/84, 347, 635, 642, 643; 438/149, 166, 587, 703, 763, 780

(56) References Cited

U.S. PATENT DOCUMENTS 5,594,569 * 1/1997 Konuma et al. ..................... 257/347

FOREIGN PATENT DOCUMENTS

| 58-105574 | 6/1983 | (JP) . |
| 3-038755 | 6/1991 | (JP) . |
| 7-226515 | 8/1995 | (JP) . |

OTHER PUBLICATIONS

English abstract re Japanese Laid–Open application No. 58–105574.
English abstract re Japanese Laid–Open application No. 07–226515.
Inui, S. et al, "Thresholdless Antiferroelectricity in Liquid Crystals and its Application to Displays," *J. Mater. Chem.*, pp. 671–673, 1996.
Yoshida, T. et al, "A Full–Color Thresholdless Antiferroelectric LCD Exhibiting Wide Viewing Angle with Fast Response Time," *SID 97 Digest*, pp. 841–844, 1997.
Furue, H. et al, "Characteristics and Driving Scheme of Polymer–Stabilized Monostable FLCD Exhibiting Fast Response Time and High Contrast Ratio with Gray–Scale Capability," *SID 98*, P–78, 1998.

* cited by examiner

Primary Examiner—Edward Wojciechowicz
(74) Attorney, Agent, or Firm—Cook, Alex, McFarron, Manzo, Cummings & Mehler Ltd.

(57) ABSTRACT

This invention improves TFT characteristics by making an interface between an active layer, especially a region forming a channel formation region and an insulating film excellent, and provides a semiconductor device provided with a semiconductor circuit made of a semiconductor element having uniform characteristics and a method of fabricating the same. In order to achieve the object, a gate wiring line is formed on a substrate or an under film, a gate insulating film, an initial semiconductor film, and an insulating film are formed into a laminate without exposing them to the atmosphere, and after the initial semiconductor film is crystallized by irradiation of infrared light or ultraviolet light (laser light) through the insulating film, patterning is carried out to obtain an active layer and a protection film each having a desired shape, and then, a resist mask is used to fabricate the semiconductor device provided with an LDD structure.

28 Claims, 16 Drawing Sheets

SEMICONDUCTOR DEVICE PROVIDED WITH SEMICONDUCTOR CIRCUIT MADE OF SEMICONDUCTOR ELEMENT AND METHOD OF FABRICATING THE SAME

BACKGROUND OF THE INVENTION

1. Field of the Invention

The present invention relates to a structure of a semiconductor device provided with a semiconductor circuit made of a semiconductor element such as an insulated gate type transistor, and a method of fabricating the same. Particularly, the invention relates to a structure of a semiconductor device provided with a semiconductor circuit made of a semiconductor element having an LDD structure formed by using organic resin, and a method of fabricating the same. The semiconductor device of the present invention includes not only a element such as a thin film transistor (TFT) or a MOS transistor, but also a display device including a semiconductor circuit constituted by these insulated gate type transistors or an electro-optical device such as an image sensor. In addition, the semiconductor device of the present invention includes also an electronic equipment having these display device and electro-optical device.

2. Description of the Related Art

Attention has been paid to an active matrix type liquid crystal display provided with a pixel matrix circuit and a driver circuit which are constituted by thin film transistors (TFTs) formed over a substrate having an insulating property. The liquid crystal display with a size of about 0.5 to 20 inches is used for a display.

At present, for the purpose of realizing a liquid crystal display enabling high fineness expression, attention has been paid to a TFT having an active layer of a crystalline semiconductor film typified by polysilicon. However, although a TFT having an active layer of a crystalline semiconductor film is superior in operation speed and driving capability as compared with a TFT having an active layer of an amorphous semiconductor film, it has a problem that fluctuation in TFT characteristics is large.

An interface between an active layer and a gate insulating film can be named as one of causes of the occurrence of this fluctuation in TFT characteristics. If this interface is polluted, the TFT characteristics are badly affected. Thus, it is important to clean the interface between the active layer and the insulating film being in contact with the active layer.

At present, a TFT is required to have high mobility, and a crystalline semiconductor film having mobility higher than an amorphous semiconductor film is regarded as the most likely active layer of a TFT. A brief outline of a conventional method of fabricating a TFT will be described below.

First, a gate wiring line is formed on an insulating substrate, a gate insulating film and an amorphous silicon film are stacked thereon, and the amorphous silicon film is subjected to a crystallizing process such as heating or irradiation of laser light, so that the amorphous silicon film is transformed into a polysilicon film. Next, this polysilicon film is patterned into a desired shape to form an active layer. Next, an impurity to give P type or N type conductivity is selectively introduced into the polysilicon film, so that impurity regions which become a source region and a drain region are formed. Subsequently, an interlayer insulating film is deposited, and contact holes to expose portions on the source region and the drain region are formed, and then, a metal film is formed and is patterned, so that metal wiring lines being in contact with the source region and the drain region are formed. In this way, fabricating steps of the TFT are completed.

Like this, in the conventional method, since the insulating film is formed after some steps (for example, crystallizing step, patterning step) are carried out subsequent to the formation of the amorphous semiconductor film, the amorphous semiconductor film is exposed to the atmosphere.

Especially the atmosphere in a clean room contains boron mainly from a LIEPA filter (high efficiency particulate air-filter) generally used for cleaning, and when an active layer is exposed to the atmosphere, an indefinite amount of boron is mixed into the active layer. Conventionally, fabrication was made while the active layer was exposed to the atmosphere, and in the case where the SIMS analysis was carried out, an interface (at a main surface side or rear surface side) of an active layer of a TFT had a concentration peak (indicated by a broken line B in FIG. 14) of boron, and its maximum value was $1 \times 10^{18}$ atoms/cm$^3$ or more. When boron is mixed into the active layer like this, it becomes difficult to control the concentration of impurities in the active layer, which causes the fluctuation of threshold values of TFTs. In the case where another filter is used, the cost becomes so high that this is not suitable.

Like this, in the conventional method, after a semiconductor film is formed, the surface of the semiconductor film is exposed to the atmosphere, and the semiconductor film which becomes an active layer is polluted by impurities (boron, oxygen, moisture, sodium, etc.) in the atmosphere. Besides, after formation of a gate insulating film, the semiconductor film which becomes the active layer is formed on the gate insulating film which has been exposed to the atmosphere and has been polluted, so that the semiconductor film is polluted by the impurities (boron, oxygen, moisture, sodium, etc.) in the atmosphere. When a semiconductor element, for example, a TFT is fabricated by using the semiconductor film polluted in this way, characteristics of an interface between the active layer, especially a channel formation region and the gate insulating film are degraded, which causes fluctuation and deterioration of electrical characteristics of TFTs. Besides, also in a crystallizing step, the impurities (boron, oxygen, moisture, sodium, etc.) hinder crystallization of the semiconductor film.

Besides, a structure of a thin film transistor provided with an LDD region has been conventionally known. An example of a thin film transistor provided with an LDD region is disclosed in Japanese Patent Application Examined No. Hei. 3-38755 and Japanese Patent Application Laid-open No. Hei. 7-226515. The LDD region relieves the strength of an electric field formed between a channel formation region and a drain region, and serves to lower an OFF current of a transistor and to prevent deterioration. However, a method of fabricating an LDD structure using a conventional technique is complicated, and many steps are required.

SUMMARY OF THE INVENTION

An object of the present invention is to enhance characteristics of a TFT by improving an interface between an active layer, especially a region making a channel formation region and an insulating film, and to provide a semiconductor device provided with a semiconductor circuit made of a semiconductor element having uniform characteristics and a method of fabricating the same.

Another object of the present invention is to provide a semiconductor device provided with a semiconductor circuit made of a semiconductor element with an LDD structure which is high in reproducibility, improves stability of transistor characteristics, and is high in productivity, and a method of fabricating the same.

In order to achieve the above objects, one of the features of the present invention is that at least a gate insulating film and a semiconductor film are formed without exposing them to an atmosphere onto an insulating surface on which a gate wiring line is formed, next, crystallization by irradiation of infrared light or ultraviolet light (laser light) is carried out, and then, doping of an impurity is carried out, so that a source region and a drain region are formed. The doping of the impurity is carried out through an insulating film covering the semiconductor film. That is, the feature of the present invention is that when a TFT of a bottom gate structure (typically, inverted stagger structure) is formed, a same chamber or a multichamber apparatus, for example, a system as shown in FIG. 13 is used so that the semiconductor film to become the active layer is prevented from being exposed to the atmosphere. By such structure, pollution of the interface of the active layer is prevented, and stable and excellent electrical characteristics are realized.

An invention which the present specification includes a structure that a semiconductor device provided with a semiconductor circuit made of a semiconductor element, comprising: a gate wiring line on an insulating surface; a gate insulating film being in contact with the gate wiring line; an active layer being in contact with the upper surface of the gate insulating film; a protection film being in contact with the upper surface of the active layer; and an organic resin being in contact with the protection film and added with a trivalent or pentavalent impurity element, wherein the protection film covers at least a part of a source region, a drain region, and a channel formation region formed between the source region and the drain region, which constitute the active layer.

In the above structure, the trivalent or pentavalent impurity element is phosphorus or boron.

In the above structure, the organic resin has photosensitivity.

In the above structure, the organic resin has a light shielding property.

In the above structure, the protection film is formed through at least a forming step with irradiation of infrared light or ultraviolet light to an initial semiconductor film.

Further, in the above structure, the active layer is a crystalline semiconductor film formed through at least a step of crystallizing an initial semiconductor film by irradiation of infrared light or ultraviolet light through the protection film.

In addition, the gate insulating film, the initial semiconductor film, and the protection film are formed through at least a step of sequential laminate formation without exposure to an atmosphere.

In the above structure, a concentration of a trivalent or pentavalent impurity in the organic resin is $1 \times 10^{19}$ atoms/cm$^3$ or more.

In the above structure, a concentration of boron in a semiconductor film at an interface between the gate insulating film and the channel formation region or at an interface between the protection film and the channel formation region is $3 \times 10^{17}$ atoms/cm$^3$ or less.

Furthermore, in the above structure, a concentration of oxygen in a semiconductor film at an interface between the gate insulating film and the channel formation region or at an interface between the protection film and the channel formation region is $2 \times 10^{19}$ atoms/cm$^3$ or less.

In the above structure, a concentration of carbon or nitrogen in a semiconductor film at an interface between the gate insulating film and the channel formation region or at an interface between the protection film and the channel formation region is $5 \times 10^{18}$ atoms/cm$^3$ or less.

In the above structure, the gate wiring line has a single layer structure or laminate structure, and is made of a material mainly containing one kind of element selected from the group consisting of aluminum, tantalum, molybdenum, titanium, chromium, and silicon, or a material mainly containing silicon added with a P-type or N-type impurity.

In the above structure, the protection film has a thickness of 5 to 50 nm.

Incidentally, in the present specification, the term "initial semiconductor film" means a semiconductor film generically, and typically indicates a semiconductor film having amorphous, for example, an amorphous semiconductor film (amorphous silicon film, etc.), an amorphous semiconductor film having microcrystal, or a microcrystalline semiconductor film, and these semiconductor films include a Si film, a Ge film, and a compound semiconductor film (for example, $Si_X Ge_{1-X}$ (0<X<1), typically an amorphous silicon germanium film indicated by X=0.3 to 0.95, etc.). This initial semiconductor film can be formed by a well-known technique, for example, a low pressure CVD method, a thermal CVD method, a PCVD method, or a sputtering method.

Besides, in the present specification, the term "crystalline semiconductor film" indicates a single crystal semiconductor film, and a semiconductor film (including a polycrytal semiconductor film and a microcrystal semiconductor film) containing crystal grain boundaries, and is clearly distinguished from a semiconductor (amorphous semiconductor film) which is in an amorphous state over the whole region. Of course, in the present specification, it is needless to say that the recitation "semiconductor film" also includes an amorphous semiconductor film in addition to the crystalline semiconductor film.

Besides, in the present specification, the term "semiconductor element" indicates a switching element or a memory element, for example, a thin film transistor (TFT), a thin film diode (TFD), or the like.

Moreover, one of the features of the present invention is that an LDD region is formed by using, for example, a photosensitive organic material film, a silicon oxide film, or the like as a mask on a protective film. Furthermore, the present invention is characterized in that an active layer, especially a channel formation region is protected against deterioration due to light by using the mask used for formation of the LDD structure as a light shielding film, and a removing step of the mask is omitted. In addition, at a crossing portion of a gate wiring line and other wiring lines, the mask functions as an insulating film, so that interwiring capacitance can be reduced.

Moreover, a structure of a first method of fabricating a semiconductor device provided with a semiconductor circuit made of a semiconductor element, comprising the steps of: forming a gate insulating film and an initial semiconductor film into a laminate sequentially without exposing them to an atmosphere onto an insulating surface on which a gate wiring line has been formed; forming an oxide film at the same time as formation of a crystalline semiconductor film by crystallizing the initial semiconductor film with irradiation of infrared light or ultraviolet light; and adding a trivalent or pentavalent impurity element through the oxide film into a region to become a source region or drain region of the crystalline semiconductor film after covering a region to become a channel formation region of the crystalline semiconductor film with a mask.

Moreover, a structure of a second method of fabricating a semiconductor device provided with a semiconductor circuit made of a semiconductor element, comprising the steps of: forming a gate insulating film, an initial semiconductor film, and an insulating film into a laminate sequentially without exposing them to an atmosphere onto an insulating surface on which a gate wiring line has been formed; obtaining a crystalline semiconductor film by crystallizing the initial semiconductor film with irradiation of infrared light or ultraviolet light through the insulating film; and adding a trivalent or pentavalent impurity element through the insulating film into a region to become a source region or drain region of the crystalline semiconductor film after covering a region to become a channel formation region of the crystalline semiconductor film with a mask.

The structure of each of the fabricating methods is characterized in that the gate insulating film, the initial semiconductor film, and the protection film are formed by using, chambers different from one another.

The structure of each of the fabricating methods is characterized in that the grate insulating film, the initial semiconductor film, and the protection film are formed by using a same chamber.

The structure of each of the fabricating methods is characterized in that the gate insulating film and the protection film are formed by using a first chamber and the initial semiconductor film is formed by using a second chamber.

The structure of each of the fabricating methods is characterized in that contaminants on a film forming surface are reduced with active hydrogen or a hydrogen compound before the initial semiconductor film is formed.

The structure of each of the fabricating methods is characterized by comprising a step of forming a silicon nitride film before the gate insulating film is formed.

The structure of each of the fabricating methods is characterized by comprising a step of forming a laminate film containing BCB (benzocyclobutene) as a part of the gate insulating film.

DETAILED DESCRIPTION OF THE PREFERRED EMBODIMENTS

Preferred embodiments of the present invention will be described below in detail.

Although the preferred embodiments of the present invention will be described below, it is needless to say that the present invention is not limited to these embodiments.
[Embodiment 1]

In this embodiment, an example of a case where an inverted stagger type TFT is fabricated by using the present invention will be described. In this embodiment, a description will be made using a CMOS circuit constituted by an N-channel TFT and a P-channel TFT.

The brief description will be made using FIGS. 1 to 4 which are simplified sectional views showing a semiconductor device of the present invention and a method of fabricating the same.

First, a substrate 100 is prepared. As the substrate 100, an insulating substrate such as a glass substrate, a quartz substrate, or a crystalline glass substrate, a ceramic substrate, a stainless substrate, a metal (tantalum, tungsten, molybdenum, etc.) substrate, a semiconductor substrate, a plastic substrate (polyethylene terephthalate substrate), or the like can be used. In this embodiment, a glass substrate (Corning 1737; distortion point 667° C.) was used as the substrate 100.

Next, an under film 101 is formed on the substrate 100. As the under film 101, a silicon oxide film, a silicon nitride film, a silicon nitride oxide film ($SiO_xN_y$), or a laminate film of these can be used. The under film 101 can be used within the thickness range of 200 to 500 nm. In this embodiment, as the under film 101, a silicon nitride film with a thickness of 300 nm was formed, and diffusion of contaminants from the glass substrate was prevented. Although the present invention can be carried out even if the under film is not provided, for the purpose of making the TFT characteristics excellent, it is preferable to provide the under film.

Figure 1A:
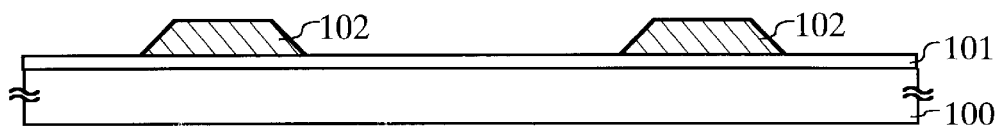
FIGS. 1A to 1E are views showing fabricating steps of TFTs (Embodiment 1)

Next, a gate wiring line 102 having a single layer structure or laminate structure is formed (FIG. 1A). The gate wiring line 102 is made a structure including at least one layer mainly containing a conductive material or semiconductor material, for example, aluminum (Al), tantalum (Ta), niobium (Nb), hafnium (Hf), zirconium (Zr), titanium (Ti), chromium (Cr), silicon (Si) added with a P-type or N-type impurity, or silicide. In this embodiment, although not shown for simplification, the gate wiring line 102 was made a laminate structure in which a tantalum film was sandwiched between tantalum nitride films. Since tantalum has a work function near silicon, a shift of a threshold value of a TFT is small, and it is one of the preferable materials. The gate wiring line 102 can be used within the thickness range of 10 to 1000 nm, preferably 30 to 300 nm. Incidentally, for the purpose of protecting the gate wiring line, a step of forming an anodic oxidation film or an oxidation film may be added. Besides, for the purpose of preventing impurities from diffusing from the substrate or the gate wiring line to the gate insulating film during the fabricating steps, a step of forming an insulating film covering the gate wiring line and the substrate may be added.

Next, a gate insulating film 103, an initial semiconductor film 104, and an insulating film 105 are sequentially formed into a laminate without exposing to the atmosphere. At this time, although either means of a plasma CVD method, a sputtering method and the like may be used as forming means, it is important to prevent the films from being exposed to the atmosphere so that contaminants from the atmosphere are not attached to an interface of any layer. In this embodiment, a multichamber (apparatus shown in FIG. 13) including a chamber exclusively used for formation of the gate insulating film, a chamber exclusively used for formation of the initial semiconductor film, and a chamber exclusively used for formation of the insulating film is used, and the films are formed into a laminate by transferring the respective chambers while high vacuum is kept.

Figure 13:
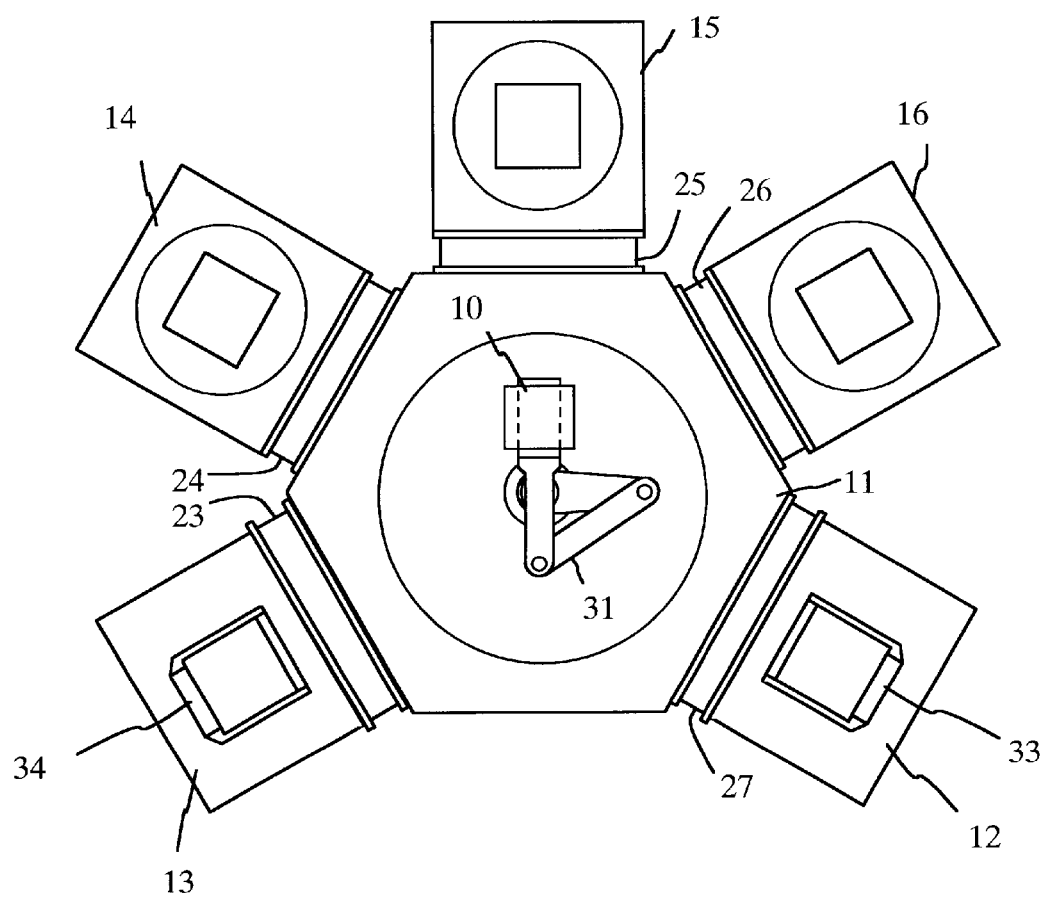
FIG. 13 is a view showing an example of a film forming apparatus (Embodiment 1)

FIG. 13 schematically shows the apparatus (continuous film formation system) in this embodiment seen from the above. In FIG. 13, reference numerals 12 to 16 designate chambers with airtightness. A vacuum evacuating pump and an inert gas introducing system are disposed in each of the chambers.

The chambers 12 and 13 are load lock chambers for transferring a sample (substrate to be processed) 10 into the system. Reference numeral 14 designates a first chamber for forming a gate insulating film (silicon nitride oxide film) 103. Reference numeral 15 designates a second chamber for forming a semiconductor film (amorphous silicon film) 104. Reference numeral 16 designates a third chamber for forming an insulating film (silicon nitride oxide film) 105. Reference numeral 11 designates a common chamber of a sample commonly disposed for the respective chambers.

An example of operation will be described below.

First, all the chambers are once evacuated into a high vacuum state, and then, are made in a state (normal pressure) purged by an inert gas, here, by nitrogen. Further, they are made in a state where all gate valves are closed.

First, a substrate to be processed, together with a cassette 34 containing a number of substrates to be processed, is transferred into the load lock chamber 13. After the cassette is transferred, a not-shown door of the load lock chamber is closed. In this state, a gate valve 23 is opened, one substrate to be processed 10 is taken out from the cassette, and is transferred into the common chamber 11 by a robot arm 31. At this time, alignment of the substrate is carried out in the common chamber.

Here, the gate valve 23 is closed, and a gate valve 24 is opened. Then the substrate to be processed 10 is transferred into the first chamber 14. A film forming process is carried out at a temperature of 150° C. to 300° C. in the first chamber, so that the gate insulating film 103 is obtained. As the gate insulating film 103, a silicon oxide film, a silicon nitride film, a silicon nitride oxide film (SixNy), a laminate film of these, or the like may be used within the thickness range of 100 to 400 nm (typically 150 to 250 nm). In this embodiment, although an insulating film of a single layer is used as the gate insulating film, a laminate structure of two layers or three or more layers may be adopted.

After the gate insulating film is formed, the substrate to be processed 10 is drawn by the robot arm 31 into the common chamber, and is transferred into the second chamber 15. In the second chamber, similarly to the first chamber, a film formation process is carried out at a temperature of 150° C. to 300° C., so that the initial semiconductor film 104 is obtained. As the initial semiconductor film 104, an amorphous silicon film, an amorphous semiconductor film including microcrystal, a microcrystal semiconductor film, an amorphous germanium film, an amorphous silicon germanium film expressed as $Si_XGe_{1-X}$ (0<X<1), or a laminate film of these may be used within the thickness range of 20 to 70 nm (typically 40 to 50 nm).

Incidentally, such a structure may be adopted that the formation temperature of the initial semiconductor film 104 is made 350° C. to 500° C. (typically 450° C.) to omit a heat treatment of lowering the hydrogen concentration in the initial semiconductor film.

Besides, a microcrystal semiconductor film formed under the condition that a formation temperature is made 80° C. to 300° C., preferably 140° C. to 200° C., a silane gas ($SiH_4:H_2=1:10$ to 100) diluted with hydrogen is made a reaction gas, a gas pressure is made 0.1 to 10 Torr, and a discharge power is made 10 to 300 mW/cm$^2$, has a hydrogen concentration low in the film. Thus, if this film is used as the initial semiconductor film, a heat treatment to reduce a hydrogen concentration can be omitted.

After the initial semiconductor film is formed, the substrate to be processed 10 is drawn out into the common chamber by the robot arm 31, and is transferred into the third chamber 16. In the third chamber, similarly to the first chamber, a film formation process is carried out at a temperature of 150° C. to 300° C., so that an insulating film is obtained. As the insulating film 105, a silicon oxide film, a silicon nitride film, a silicon nitride oxide film (expressed as $SiO_xN_y$), or a laminate film of these can be used within the thickness range of 5 to 50 nm (typically 10 to 20 nm). This insulating film 105 is provided to protect the surface of the initial semiconductor film 104 against pollution by impurities contained in the atmosphere. Since the insulating film 105 is superior in adhesion to a resist, it is preferable in subsequent formation of the resist.

The substrate to be processed on which the three layers have been continuously formed in this way is transferred into the load lock chamber 12 by the robot arm, and is stored in a cassette 33.

Like this, in this embodiment, for the purpose of preventing pollution (mainly inhibition of crystallization by oxygen) occurring at the formation of the insulating film by using the apparatus shown in FIG. 13, laminate formation was made in the chambers different from one another. Incidentally, it is needless to say that the apparatus shown in FIG. 13 is merely an example.

Figure 1B:
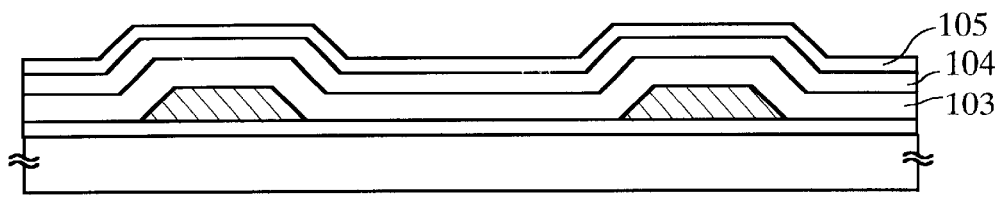

In this embodiment, a silicon nitride oxide film with a thickness of 125 nm as the gate insulating film 103, an amorphous silicon film with a thickness of 50 nm as the initial semiconductor film 104, and a silicon nitride oxide film with a thickness of 15 nm as the insulating film 105 were formed into a laminate (FIG. 1B). Of course, the thickness of each film is not limited to this embodiment, but a person who carries out the invention may suitably determine the thickness. Besides, such a structure may be adopted that laminate formation is performed by exchanging a reaction gas in the same chamber. Besides, it is preferable to adopt such a structure that contaminants on a film forming surface of the gate insulating film are reduced by active hydrogen or a hydrogen compound before the initial semiconductor film is formed.

After the state of FIG. 1B is obtained in this way, crystallization by irradiation of infrared light or ultraviolet light (hereinafter referred to as laser crystallization) to the initial semiconductor film 104 is carried out. In the case where ultraviolet light is used for the crystallization technique, excimer laser light or intense light emitted from an ultraviolet lamp may be used. In the case where infrared light is used, infrared laser light or intense light emitted from an infrared lamp may be used. In this embodiment, excimer laser light was shaped into a linear beam and irradiation was made. As the irradiation condition, a pulse frequency is 150 Hz, an overlap ratio is 80 to 98%, 96% in this embodiment, and a laser energy density is 100 to 500 mJ/cm$^2$, preferably 150 to 200 mJ/cm$^2$, 175 mJ/cm$^2$ in this embodiment. The condition of laser crystallization (wavelength of laser light, overlap ratio, irradiation intensity, pulse width, repetition frequency, irradiation time, etc.) may be suitably determined by a person who carries out the invention in view of the thickness of the insulating film 105, the thickness of the initial semiconductor film 104, substrate temperature, and the like. According to the condition of laser crystallization, there is a case where the initial semiconductor film is crystallized through a melted state or a case where the initial semiconductor film is not melted but is crystallized in a solid phase state or an intermediate state of a solid phase and a liquid phase. Laser light was made to continuously move at a constant speed and was made constant in any region within a range of ±10% of the overlap ratio.

Figure 1C:
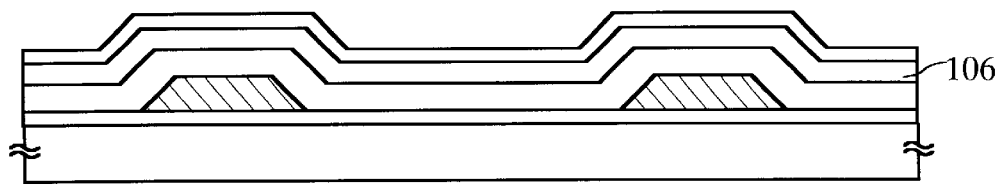

By this step, the initial semiconductor film 104 is crystallized, and is transformed into a crystalline semiconductor film (semiconductor film containing crystals) 106 (FIG. 1C). In this embodiment, the crystalline semiconductor film is a polycrystal silicon film. In this step, since irradiation of laser light is carried out from the upper part of the insulating film 105, there is no fear that contaminants from the atmosphere are mixed into the initial semiconductor film. That is, crystallization of the initial semiconductor film can be made while cleanness of the interface of the initial semiconductor film is maintained.

Incidentally, after the step of FIG. 1C, an impurity may be added to perform threshold control, and a step of adding an impurity through a protection film into a region which becomes a channel formation region may be added.

Figure 1D:
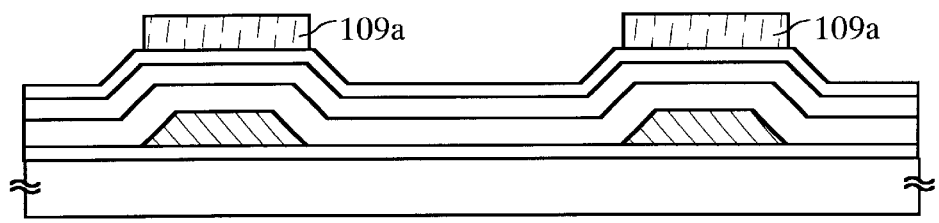

Next, by exposure from the rear surface, a first mask (in this embodiment, a resist mask) 109a having a thickness of 1 to 3 μm and being in contact with the insulating film 105 over the gate wiring line was formed (FIG. 1D). As a material of the mask, positive or negative photosensitive organic material (for example, resist), silicon oxide, silicon nitride, or silicon nitride oxide (expressed as SiO$_x$N$_y$) may be used. Since formation of a resist by exposure from the rear surface does not require a mask, the number of fabricating masks can be reduced. Actually, although the width of the first mask may become slightly smaller than the width of the gate wiring line by spreading and bending of light, this is not shown for simplification.

Incidentally, in the present specification, in the case where the substrate 100 is cut along a plane vertical to a substrate plane, a direction in which the distance from the substrate becomes large is made upper, and a direction in which the distance from the substrate becomes small is made lower.

Figure 1E:
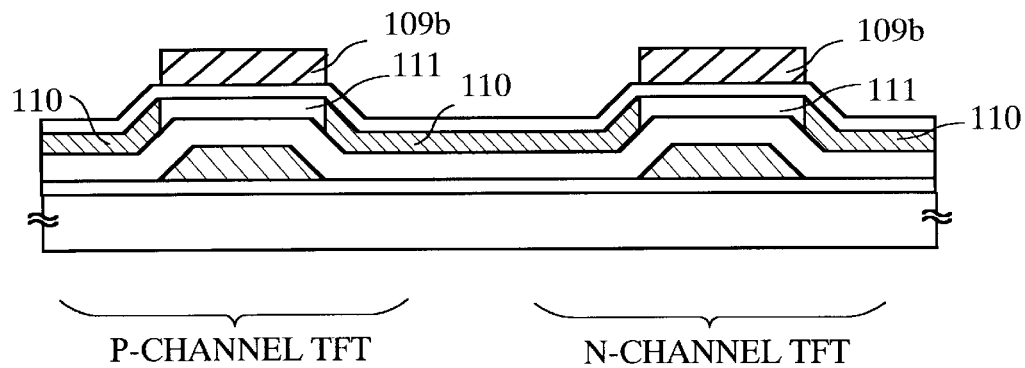

Then this first mask 109a was used and addition of a first impurity was carried out through the insulating film 105, so that a low concentration impurity region (n$^-$-type region) 110 was formed (FIG. 1E). In this embodiment, a phosphorus element was used as an impurity to give N-type conductivity, and adjustment was made so that the phosphorus concentration of the n$^-$-type region 110 became $1 \times 10^{15}$ to $1 \times 10^{17}$ atoms/cm$^3$ according to the SIMS analysis. At this time, the phosphorus element is added into the first mask, so that a first mask 109b containing a phosphorus element with a low concentration is made.

Figure 2A:
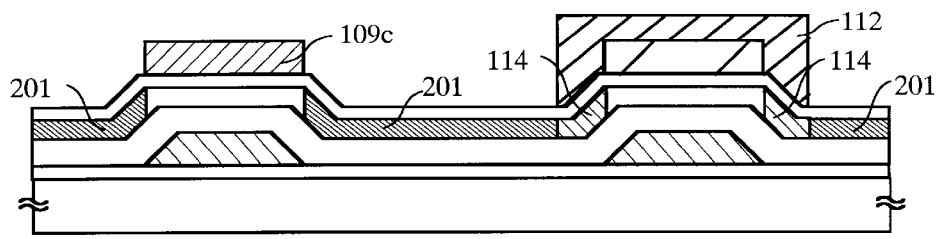
FIGS. 2A to 2E are views showing fabricating steps of the TFTs (Embodiment 1)

Next, a second mask 112 formed to cover the first mask 109b of the N-channel TFT and having a thickness of 1 to 3 μm was used, and a second impurity was added through the protection film 108, so that a high concentration impurity region (n$^+$-type region) 201 was formed (FIG. 2A). In this embodiment, adjustment was made so that the phosphorus concentration of the n$^+$-type region 201 became $1 \times 10^{20}$ to $8 \times 10^{21}$ atoms/cm$^3$ according to the SIMS analysis. The first mask 109c in the P-channel TFT was added with the phosphorus element having a high concentration. Similarly, as compared with the first mask, a phosphorus element having a high concentration is added in the second mask 112. The concentration of the first mask 109b at the side of the channel formation region of the N-channel TFT is made low to prevent phosphorus from being erroneously added in the channel formation region. Besides, in this embodiment, as a material of the second mask 112, polyimide resin having photosensitivity was used.

An LDD structure is formed by the above first and second impurity adding steps. The boundary between the n$^-$-type region and the n$^+$-type region is determined by the shape of the second mask 112. Incidentally, in the N-channel TFT, the n$^+$-type region 201 becomes a source region or drain region, and the n$^-$-type region becomes a low concentration impurity region 114.

Besides, in the above first and second impurity adding steps, the first masks 109b and 109c and the second mask 112 added with phosphorus were blackened. Besides, a step of further blackening the first mask and the second mask may be added.

Figure 2B:
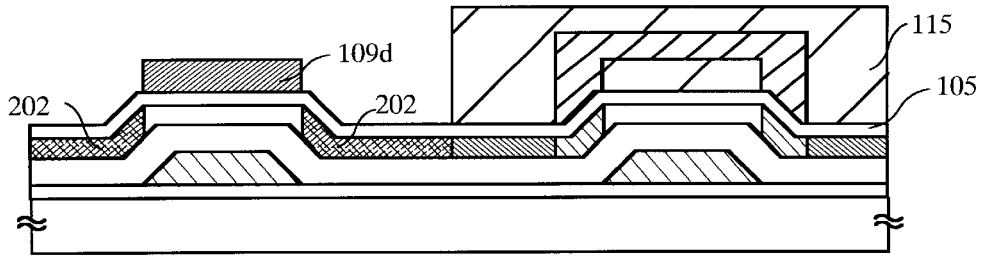

Next, the N-channel TFT was covered with a third mask 115, and addition of a third impurity was carried out through the protection film 108, so that a high concentration impurity region (P-type region) 202 was formed (FIG. 2B). In this embodiment, a boron element is used as an impurity to give P-type conductivity, and a dosage of boron ion is made such that the concentration of boron in the P-type region becomes 1.3 to 2 times the concentration of phosphorus ion added into the n$^+$-type region. The boron element having a high concentration was added in the first mask 109d in the P-channel TFT. Similarly, the boron element is also added in the third mask 115. Incidentally, a trivalent impurity (in this embodiment, boron) or a pentavalent impurity (in this embodiment, phosphorus) with a concentration of $1 \times 10^{19}$ atoms/cm$^3$ or more is contained in the first to third masks, that is, in the organic resin.

In the P-channel TFT, the P-type region 202 becomes a source region or drain region. A region where a phosphorus ion or boron ion was not injected becomes an intrinsic or substantially intrinsic channel formation region 111 which becomes a carrier transfer passway later.

Incidentally, in the present specification, the term "intrinsic" indicates a region which does not contain any impurity capable of changing Fermi level of silicon, and the term "substantially intrinsic" indicates a region where electrons and holes are completely balanced with each other to cancel out conductivity types, that is, a region containing an impurity to give an N type or P type within the concentration range ($1 \times 10^{15}$ to $1 \times 10^{17}$ atoms/cm$^3$ according to the SIMS analysis) in which threshold value control can be made, or a region where conductivity types are cancelled out by intentionally adding an opposite conductivity impurity.

The above first to third impurity adding steps may be made by using well-known means such as an ion implantation method, a plasma doping method, or a laser doping method. However, a doping condition, a dosage, an acceleration voltage, and the like are adjusted so that an impurity ion with a desired amount is added through the protection film 108 into a predetermined region of an active layer.

Besides, in the first to third impurity adding steps, since injection of an impurity is carried out from the upper portion of the insulating film 105, there is no fear that contaminants from the atmosphere, especially boron is mixed into the active layer. Thus, since the concentration of impurities in the active layer can be controlled, fluctuation of threshold values can be suppressed.

Besides, when a person who carries out the invention suitably sets the patterns of the first to third masks, it is possible to relatively easily obtain the n$^-$-type region, n$^+$-type region, P-type region and channel formation region each having a desired width.

Figure 2C:
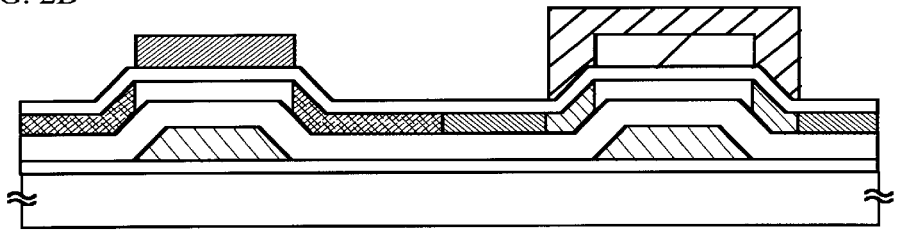

After the high concentration impurity regions 201 and 202 which become a source region or drain region, and the low concentration impurity region 114 are formed in this way, only the third mask 115 is selectively removed (FIG. 2C). A selectively removing step may be made by making a material used for the third mask different from a material of the first and second masks. In this mask removing step, the insulating film 105 becomes an etching stopper. Since the insulating film has been also formed in this mask removing step, contaminants do not mix into the crystalline semiconductor film, especially the channel formation region 111.

Next, a well-known technique for obtaining an activating effect of impurities in the source region and the drain region or a restoring effect of the crystal structure of the active layer damaged in the doping step, for example, thermal annealing or laser annealing is carried out.

Figure 2D:
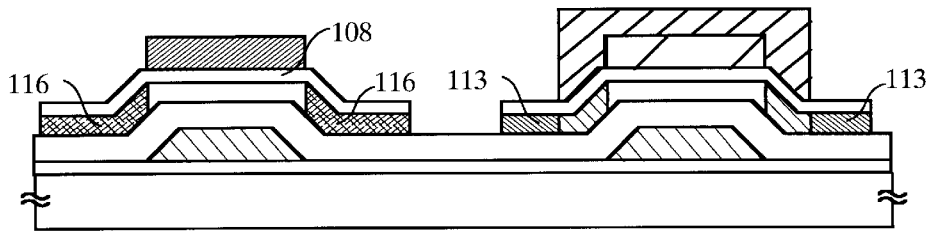

Next, by using the same mask (not-shown fourth mask), the crystalline silicon film and the insulating film 105 were patterned to form an active layer (made of the n$^-$-type region 114, n$^+$-type region 113, P-type region 116, and channel formation region 111) and the protection film 108 (FIG. 2D). In this step as well, only the mask (fourth mask) used for patterning of the active layer was selectively removed. Like this, by keeping the state where the crystalline silicon film was covered with the insulating film 105 to the utmost degree, the film was protected against pollution by the atmosphere. In addition, formation of an insulating film for protecting the side of the active layer 107 may be carried out. Besides, the gate insulating film may be selectively removed by using the same mask (fourth mask). Besides, such a structure may be adopted that patterning is carried out before the adding steps of the impurity regions.

Figure 2E:
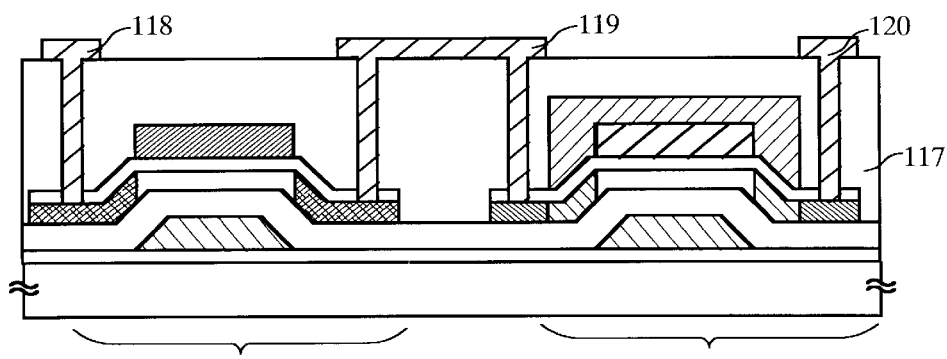

Finally, an interlayer insulating film 117 made of organic resin such as polyimide, polyimideamide, polyamide or acryl, a silicon oxide film, a silicon nitride film, a silicon nitride oxide film (expressed as SiO$_x$N$_y$), or a laminate film of these is formed, and after contact holes to expose the portions above the source region and the drain region are formed, a metal film, for example, a laminate of Ti/Al/Ti, is formed, and this is patterned to form metal wiring lines 118 to 120 being in contact with the source region and the drain region (FIG. 2E). In this way, fabrication of the CMOS circuit constituted by the N-channel TFT and the P-channel TFT in this embodiment of the present invention is completed.

By using the apparatus shown in FIG. 13, at the interface between the gate insulating film and the channel formation region, or the interface between the protection film and the channel formation region, it was possible to make the concentration of oxygen 2×10$^{19}$ atoms/cm$^3$ or less, and to make the concentration of carbon or nitrogen 5×10$^{18}$ atoms/cm$^3$ or less.

With respect to a semiconductor device provided with a semiconductor circuit made of a semiconductor element using the above fabricating steps, an example of its structure will be described with reference to FIG. 3. The semiconductor device of the present invention includes a peripheral driver circuit portion and a pixel matrix circuit portion on the same substrate. In this embodiment, for making illustration easy, a CMOS circuit constituting a part of the peripheral driver circuit portion and a pixel TFT (N-channel TFT) constituting a part of the pixel matrix circuit portion are shown on the same substrate.

Figure 3:
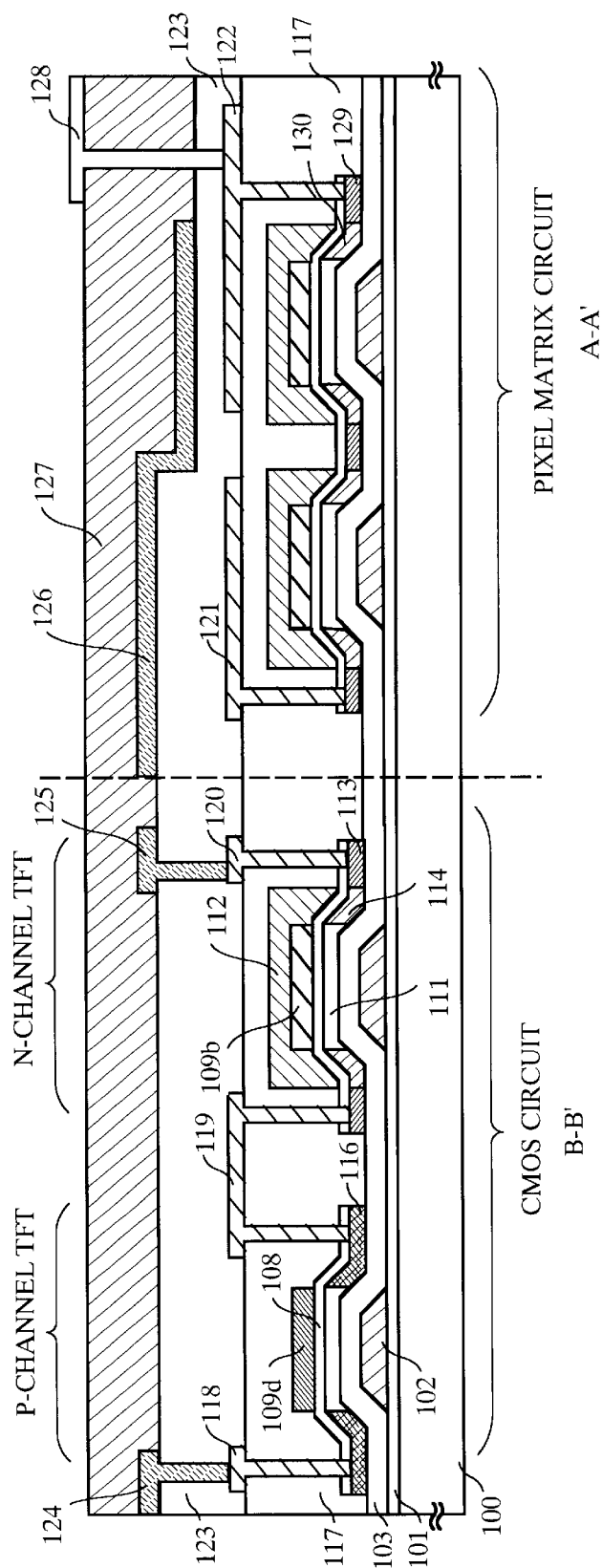
FIG. 3 is a sectional view showing an example of a structure of a semiconductor device (Embodiment 1)
Figure 4A:
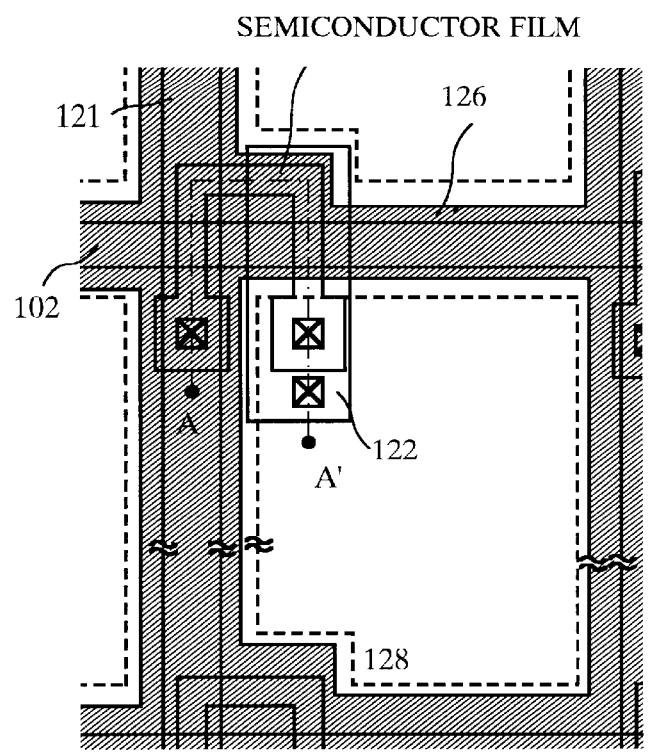
FIGS. 4A and 4B are top views of a pixel matrix circuit and a CMOS circuit (Embodiment 1)
Figure 4B:
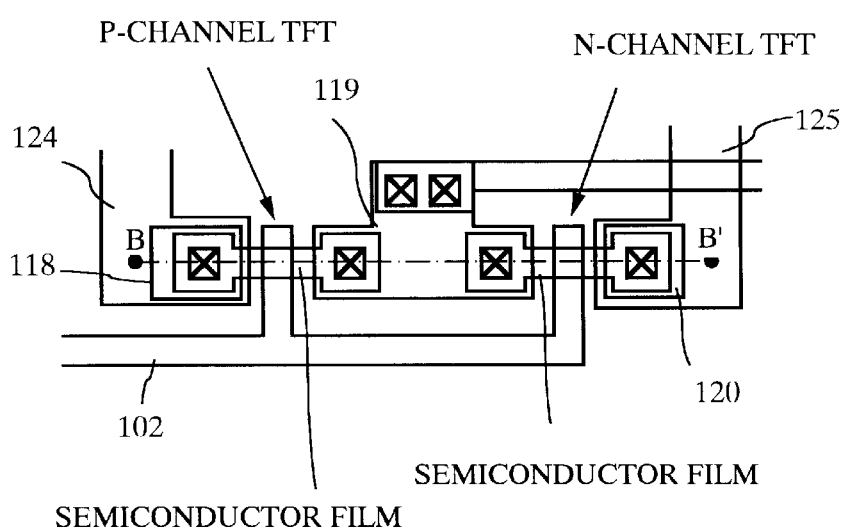

FIGS. 4A and 4B are views corresponding to top views of FIG. 3, and in FIGS. 4A and 4B, a portion cut along thick line A–A' corresponds to the sectional structure of the pixel matrix circuit of FIG. 3, and a portion cut along thick line B–B' corresponds to the sectional structure of the CMOS circuit of FIG. 3. Reference numerals used in FIG. 3 and FIGS. 4A and 4B are the same as those of FIG. 1 or FIG. 2.

In FIG. 3, any TFT (thin film transistor) is formed on an under film 101 provided on a substrate 100. In the case of the P-channel TFT of the CMOS circuit, a gate wiring line 102 is formed on the under film, and a gate insulating film 103 is provided thereon. A P-type region 116 (source region or drain region) and a channel formation 111 are formed as an active layer on the gate insulating film. The active layer is protected by a protection film 108 having the same shape. Contact holes are formed in a first interlayer insulating film 117 covering the protection film 108, and wiring lines 118 and 119 are connected to the P-type region 116. A second interlayer insulating film 123 is further formed thereon, a lead wiring line 124 is connected to the wiring line 118, and a third interlayer insulating film, for example, an acryl film, 127 is formed covering them. A first mask 109d having a light shielding property is formed on at least the protection film over the channel formation region, and protects the channel formation region against deterioration by light.

On the other hand, in the N-channel TFT, an n$^+$-type region 113 (source region or drain region), a channel formation region 111, and an n$^-$-type region 114 between the n$^+$region and the channel formation region are formed as an active layer. Wiring lines 119 and 120 are formed in the n$^+$-type region 113, and a lead wiring line 125 is connected to the wiring line 120. Portions other than the active layer have substantially the same structure as the P-channel TFT. A first mask 109b having a light shielding property is formed on at least the protection film over the channel formation region 111, and a second mask 112 is formed on the protection film over the n$^-$-type region 114, so that they protect the channel formation region and the n$^-$-type region against deterioration by light.

With respect to the N-channel TFT formed in the pixel matrix circuit, portions up to the formation of the first interlayer insulating film 117 have the same structure as the N-channel TFT of the CMOS circuit. Wiring lines 121 and 122 are connected to an n$^+$-type region 129, and the second interlayer insulating film 123 and a black mask, for example, a titanium film, 126 are formed thereon. This black mask covers the pixel TFT and forms auxiliary capacitance, together with the wiring line 122. Further, the third interlayer insulating film 127 is formed thereon, and a pixel electrode 128 made of a transparent conductive film such as ITO or SnO$_2$ is connected.

In the pixel matrix circuit of this embodiment, such a TFT structure is made that interwiring capacitance generated between the gate wiring line 102 and the wiring lines 121 and 122 is reduced by the first or second mask. Incidentally, in this embodiment, in addition to the pixel matrix circuit, since a resist mask is formed by rear surface exposure, the mask is provided above the gate wiring line, and interwiring capacitance to other wiring lines is reduced.

In this embodiment, although a transmission type LCD is fabricated as an example, the invention is not particularly limited to this. For example, when a metal material having reflectivity is used as a material of a pixel electrode, and change of patterning of a pixel electrode or addition/deletion of some steps is suitably carried out, a reflection type LCD can be fabricated.

Incidentally, in this embodiment, although the gate wiring line of the pixel TFT of the pixel matrix circuit is made a double gate structure, for the purpose of lowering fluctuation in OFF current, a multigate structure such as a triple gate structure may be adopted. Besides, for the purpose of increasing an opening ratio, a single gate structure may be adopted.

[Embodiment 2]

This embodiment is an example in which a crystalline silicon film is obtained by a method different from the embodiment 1. This embodiment relates to a method in which a catalytic element for promoting crystallization of silicon is used, a laser beam is shaped into a rectangle or square, and a crystalline silicon film is obtained through a uniform laser crystallization process over a region of several cm² to several hundred cm² by one shot of irradiation. Since the basic structure is almost the same as the embodiment 1, a description will be made while paying attention to only different points.

In this embodiment, in the step of FIG. 1C, excimer laser light is processed into a plane shape and irradiation is made. In the case where laser light is processed into the plane shape, it is necessary to process the laser light so that an area of about several tens cm² (preferably 10 cm² or more) can be irradiated at the same time. For the purpose of annealing the whole irradiated surface with a desired laser energy density, a laser apparatus having a total energy of 5J or more, preferably 10J or more is used.

In that case, it is preferable that the energy density is made 100 to 800 mJ/cm², and the output pulse width is made 100 nsec or more, preferably 200 nsec to 1 msec. For the purpose of realizing the pulse width of 200 nsec to 1 msec, it is appropriate that a plurality of laser apparatuses are coupled to each other, and synchronization of the respective laser apparatuses is shifted to make a state where plural pulses are mixed.

By irradiation of laser light having a plane beam shape as in this embodiment, it is possible to make uniform laser irradiation over a large area. That is, the crystallinity (including crystal grain diameter, defect density, etc.) of the active layer becomes uniform, and fluctuation of electric characteristics among TFTs can be reduced.

Incidentally, this embodiment is easily combined with the embodiment 1, and the way of combining them is free.

[Embodiment 3]

Figure 5:
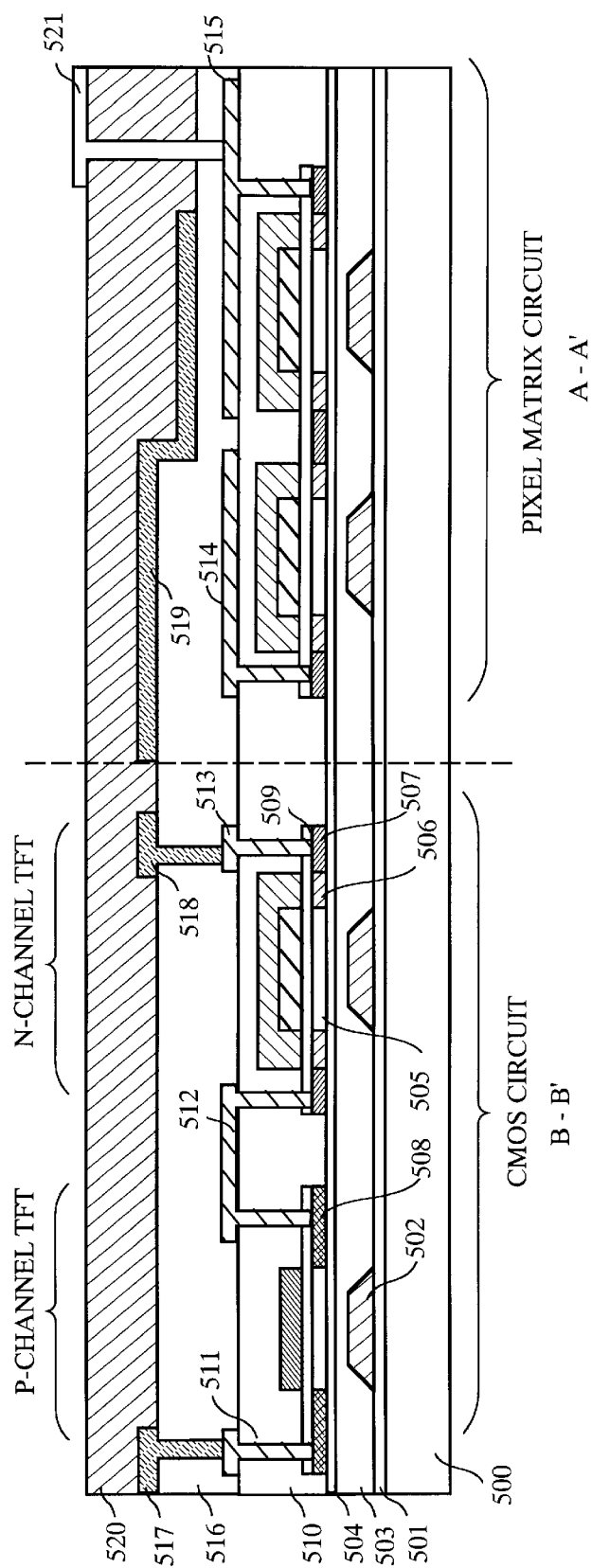
FIG. 5 is a sectional view showing an example of a structure of a semiconductor device (Embodiment 3)

In this embodiment, an example in which a TFT having a structure different from the embodiment 1 will be described with reference to FIG. 5. A top view of FIG. 5 is almost the same as FIG. 4A or 4B, although the reference numerals are different.

In this embodiment, a plastic substrate is formed as a substrate 500, a silicon nitride oxide (expressed as $SiO_xN_y$) is formed as an under film 501, and a tantalum film is formed as a gate wiring line 502.

Next, as a first insulating film 503, a film of an organic material to flatten the roughness between a region including a gate electrode and a region including no gate electrode, for example, a BCB (benzocyclobutene) film with a thickness of 100 nm to 1 μm (preferably 500 to 800 nm) is formed. In this step, it is necessary to make the film have a thickness to such a degree that a roughened portion due to the gate wiring line 502 is completely flattened. Since the flattening effect of the BCB film is large, sufficient flattening can be made even if the film thickness is not made very thick.

After the first insulating film 503 is formed, next, a second insulating film (silicon nitride oxide film) 504, an initial semiconductor film (microcrystal silicon film), and an insulating film (silicon nitride oxide film) to become a protection film 509 are sequentially formed into a laminate without opening to the atmosphere. The microcrystal silicon film can be formed under the condition that a formation temperature is made 80° C. to 300° C., preferably 140° C. to 200° C., a silane gas ($SiH_4:H_2=1:10$ to 100) diluted with hydrogen is made a reaction gas, a gas pressure is made 0.1 to 10 Torr, and a discharge power is made 10 to 300 mW/cm². Since a hydrogen concentration in the microcrystal silicon film is low, if this film is used as the initial semiconductor film, a heat treatment to reduce the hydrogen concentration can be omitted. In this embodiment, a chamber exclusively used for formation of the second insulating film, a chamber exclusively used for formation of the initial semiconductor film, and a chamber exclusively used for formation of the protection film were prepared, and movement was made through the respective chambers while high vacuum was kept, so that films were continuously formed. Since the insulating films and the semiconductor film continuously formed in this way arc formed on the flat surface, all the films are flat.

Next, irradiation of excimer laser light is made from the upper portion of the protection film, so that the semiconductor film is transformed into a semiconductor film (polycrystal silicon film) containing crystals. The condition of this laser crystallization step may be the same as the embodiment 1. At this time, since the semiconductor film is flat, the polycrystal silicon film having a uniform crystal grain diameter can be obtained. Instead of the irradiation of laser light, irradiation of intense light, for example, RTA or RTP may be used.

As described above, by using the BCB film advantageous for flattening as the first insulating film 503, the semiconductor film having a flat surface can be obtained. Thus, uniform crystallinity can be secured over the whole area of the semiconductor film.

When subsequent steps are made in accordance with the embodiment 1, a semiconductor device obtained in FIG. 5 is completed.

In FIG. 5, any TFT (thin film transistor) is formed on the under film 501 provided on the substrate 500. In the case of a P-channel TFT of a CMOS circuit, the gate wiring line 502 is formed on the under film, and the first insulating film 503 and the second insulating film 504 made of BCB are provided thereon. On the second insulating film 504, a P-type region 508 (source region or drain region) and a channel formation region 505 are formed as an active layer. The active layer is protected by a protection film 509 having the same shape. Contact holes are formed in a first interlayer insulating film 510 covering the protection film 509, and wiring lines 511 and 512 are connected to the P-type region 508. Further, a second interlayer insulating film 516 is formed thereon, a lead wiring 517 is connected to the wiring line 511, and a third interlayer insulating film 520 covering them is formed. A first mask having a light shielding property is formed at least on the protection film over the channel formation region and protects the channel formation region against deterioration by light.

On the other hand, in an N-channel TFT, an n+-type region 507 (source region or drain region), a channel formation region 505, and an n−-type region 506 between the n+-type region 506 and the channel formation region 505 are formed as an active layer. Wiring lines 512 and 513 are formed in the n+-type region 507, and a lead wiring line 518 is connected to the wiring line 513. Portions other than the active layer have substantially the same structure as the P-channel TFT. A first mask having a light shielding property is formed at least on the protection film over the channel formation region 505, and a second mask is formed on the protection film over the n−-type region 506, so that the channel formation region and the n−-type region are protected against deterioration by light.

With respect to an N-channel TFT formed in a pixel matrix circuit, portions up to the formation of the first interlayer insulating film 510 have the same structure as the N-channel TFT of the CMOS circuit. Wiring lines 514 and 515 are connected to the n+-type region 507, and a second interlayer insulating film 516 and a black mask 519 are formed thereon. This black mask covers the pixel TFT, and forms auxiliary capacitance, together with the wiring line 515. Further, a third interlayer insulating film 520 is formed thereon, and a pixel electrode 521 made of a transparent conductive film such as ITO is connected.

In the pixel matrix circuit of this embodiment, such a TFT structure is made that interwiring capacitance generated between the gate wiring line 502 and the wiring lines 514, 515 is reduced by the first or second mask. Incidentally, such structure is not limited to the pixel matrix circuit, but in this embodiment, since the resist mask is formed by rear surface exposure, the mask is provided above the gate wiring line and interwiring capacitance to other wiring lines is reduced.

The TFTs fabricated by carrying out this embodiment show electrical characteristics with less fluctuation. This embodiment can be easily combined with the embodiment 1 or embodiment 2.

[Embodiment 4]

Figure 6:
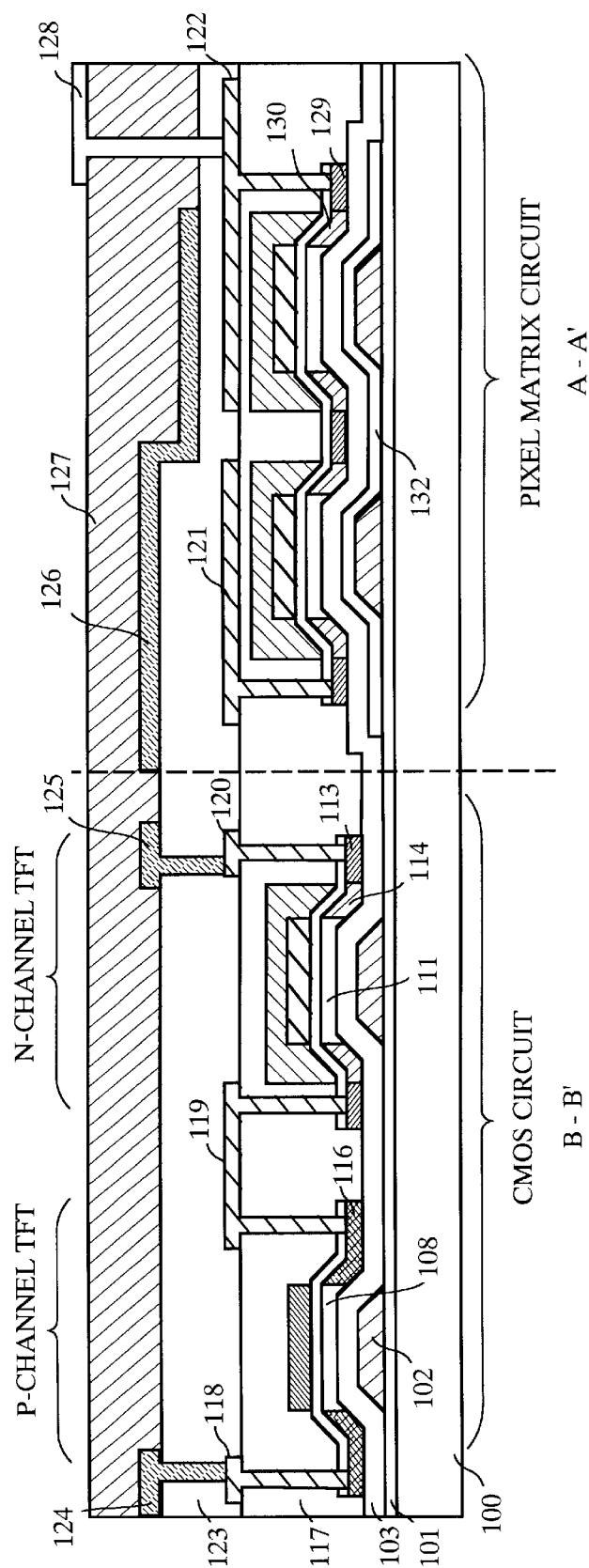
FIG. 6 is a sectional view showing an example of a structure of a semiconductor device (Embodiment 4)

In this embodiment, an example in which a TFT having a structure different from the embodiment 1 will be described with reference to FIG. 6. Since the structure in the CMOS circuit is almost the same as the embodiment 1, a description will be made while paying attention to only different points. Reference numerals used in FIG. 6 are the same as those of FIG. 1 or FIG. 2. A top view of FIG. 6 corresponds to FIG. 4A or 4B.

In this embodiment, steps up to formation of a gate wiring line 102 through formation of a glass substrate as a substrate 100 and formation of a silicon nitride oxide film (expressed as $SiO_xN_y$) as an under film 101 are the same as the embodiment 1.

Next, in this embodiment, in a pixel matrix circuit, a first insulating film 132 is selectively formed.

Thereafter, similarly to the embodiment 1, a second insulating film (corresponding to the gate insulating film of the embodiment 1) 103, an initial semiconductor film 104, and an insulating film 105 are sequentially formed into a laminate without exposing to the atmosphere. In this embodiment, while high vacuum was kept in the same chamber, a silicon nitride oxide film with a thickness of 10 to 100 nm as the second insulating film 103, an amorphous silicon film with a thickness of 50 nm as the initial semiconductor film 104, and a silicon nitride oxide film with a thickness of 15 nm as the insulating film 105 were continuously formed into a laminate by using a plasma CVD method. Of course, the respective thicknesses are not limited to this embodiment, but a person who carries out the invention may suitably determine them. In this embodiment, in the pixel matrix circuit, the films were formed so that the total thickness of the gate insulating films (first insulating film 132 and second insulating film 103) became 100 to 300 nm. The first insulating film 132 can be formed on a same material and through a same method as the second insulating film 103.

In the case where continuous film formation is made in the same chamber as in this embodiment, before the initial semiconductor film is formed, contaminants, especially oxygen on a film forming surface is reduced by active hydrogen or a hydrogen compound. Oxygen contained in the initial semiconductor film hinders crystallization. Here, oxygen attached to the inner wall of the chamber and an electrode was made an OH radical by active hydrogen or a hydrogen compound generated by a plasma process using a reaction gas such as $NH_3$, $H_2$, Ar, or He and degassing was carried out, so that incorporation of oxygen during the film formation of the initial semiconductor film was prevented. Further, it is preferable that film formation temperatures for the respective films are made the same (±50° C.), and pressures are made the same (±20%), while high vacuum is kept in the same chamber.

When the subsequent steps are carried out in accordance with the embodiment 1, a semiconductor device obtained in FIG. 6 is completed.

In FIG. 6, since the structure in the CMOS circuit is almost the same as FIG. 3 of the embodiment 1, its explanation will be omitted. With respect to the N-channel TFT formed in the pixel matrix circuit, portions other than a portion where the gate insulating film is made of a two-layer structure (first insulating film 132 and second insulating film 103) are almost the same as FIG. 3 of the embodiment 1. Like this, by selectively making the thickness of the gate insulating film thick, the reliability of a circuit (pixel matrix circuit, buffer circuit, etc.) requiring high withstand voltage is improved.

Similarly to the embodiment 1, in the pixel matrix circuit, this embodiment has such a TFT structure that interwiring capacitance generated between the gate wiring line 102 and the wiring lines 121 and 122 is reduced by the first or second mask. Incidentally, such structure is not limited to the pixel matrix circuit, but in this embodiment, since the resist mask is formed by rear surface exposure, the mask is provided above the gate wiring line and interwiring capacitance to other wiring lines is reduced.

The TFTs fabricated by carrying out this embodiment show electrical characteristics with less fluctuation. This embodiment can be combined with any one of the embodiments 1 to 3.

[Embodiment 5]

Figure 7:
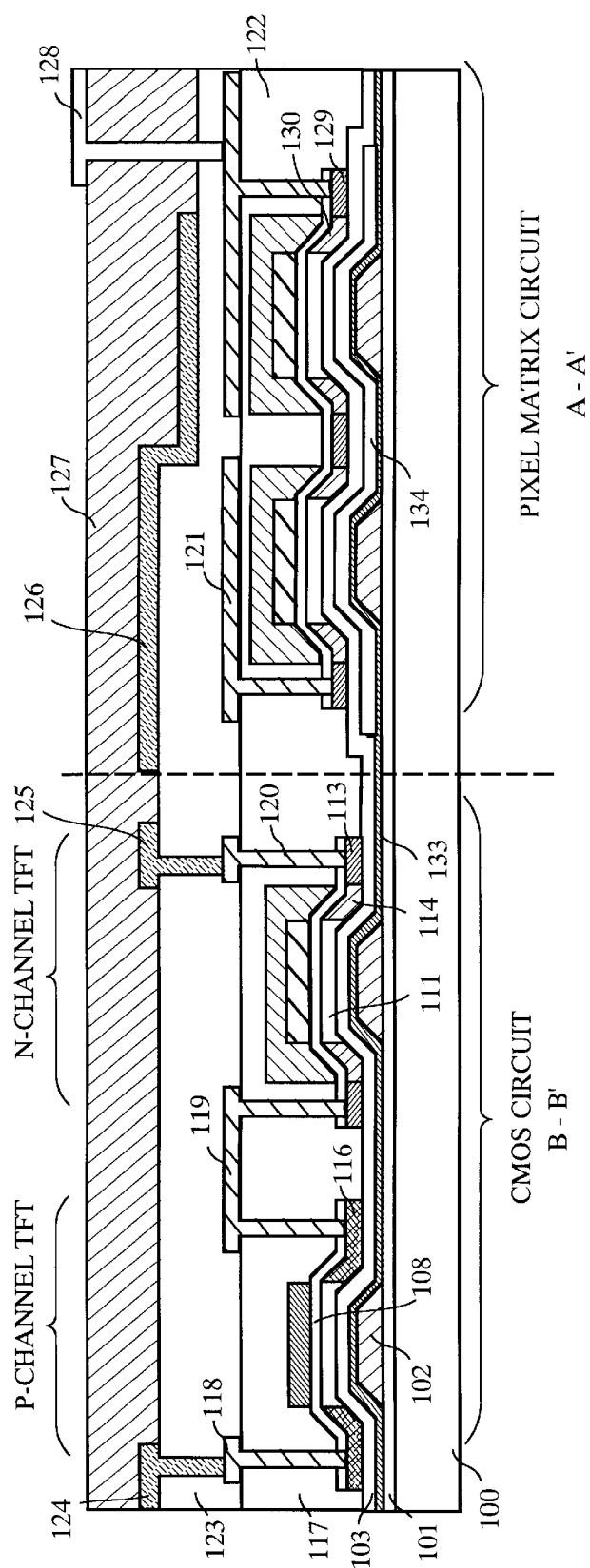
FIG. 7 is a sectional view showing an example of a structure of a semiconductor device (Embodiment 5)

In this embodiment, an example in which a TFT having a structure different from the embodiment 1 will be described with reference to FIG. 7. Incidentally, a structure of a CMOS circuit in this embodiment is almost the same as the embodiment 1 except only the different point that a gate insulating film has a two-layer structure. Reference numerals used in FIG. 7 are the same as those of FIG. 1 or FIG. 2. A top view of FIG. 7 corresponds to FIG. 4A or 4B.

In this embodiment, steps up to formation of a gate wiring line 102 through formation of a glass substrate as a substrate 100 and formation of a silicon nitride oxide film (expressed as $SiO_xN_y$) as an under film 101 are the same as the embodiment 1.

Next, in this embodiment, after a first insulating film 133 made of a silicon nitride film is formed on the whole surface, a second insulating film 134 is selectively formed in a pixel matrix circuit.

Thereafter, similarly to the embodiment 1, a third insulating film (corresponding to the gate insulating film in the embodiment 1) 103, an initial semiconductor film, and an insulating film are sequentially formed into a laminate without exposing to the atmosphere. In this embodiment, by using the apparatus shown in FIG. 13, a silicon nitride oxide film with a thickness of 10 to 100 nm as the third insulating film 103, an amorphous silicon film with a thickness of 50 nm as the initial semiconductor film, and a silicon nitride oxide film with a thickness of 15 nm as the insulating film were formed into a laminate. Of course, the respective thicknesses are not limited to this embodiment, but a person who carries out the invention may suitably determine them. In this embodiment, in the pixel matrix circuit, the films were formed so that the total thickness of the gate insulating films (first insulating film 133, second insulating film 134, and third insulating film 103) became 100 to 300 nm.

When subsequent steps are carried out in accordance with the embodiment 1, a semiconductor device obtained in FIG. 7 is completed.

In FIG. 7, since the structure of the CMOS circuit is almost the same as FIG. 3 of the embodiment 1 except the portion where the gate insulating film has the two-layer structure (first insulating film 133 and third insulating film 103), its explanation will be omitted. With respect to the N-channel TFT formed in the pixel matrix circuit, portions other than the portion where the gate insulating film has the three-layer structure (first insulating film 133, second insulating film 134, and third insulating film 103) are almost the same as FIG. 3 of the embodiment 1. Like this, by selectively making the thickness of the gate insulating film thick, reliability of a circuit (pixel matrix circuit, buffer circuit, etc.) requiring high withstand voltage is improved.

Besides, similarly to the embodiment 1, in the pixel matrix circuit, this embodiment has such a TFT structure that interwiring capacitance generated between the gate wiring line 102 and the wiring lines 121 and 122 is reduced by the first or second mask. Incidentally, such structure is not limited to the pixel matrix circuit, but in this embodiment, since the resist mask is formed by rear surface exposure, the mask is provided above the gate wiring line and interwiring capacitance to other wiring lines is reduced.

The TFTs fabricated by carrying out this embodiment show electrical characteristics with less fluctuation. This embodiment can be combined with any one of the embodiments 1 to 3.

[Embodiment 6]

Figure 8A:
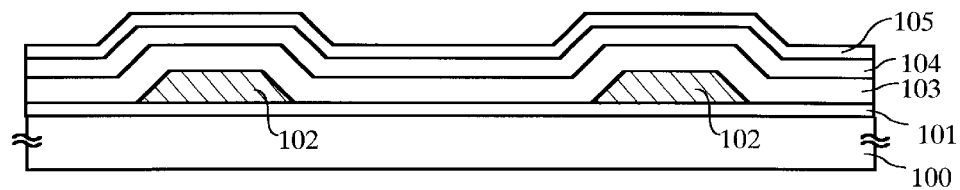
FIGS. 8A to 8E are views showing fabricating steps of TFTs (Embodiment 6)
Figure 8B:
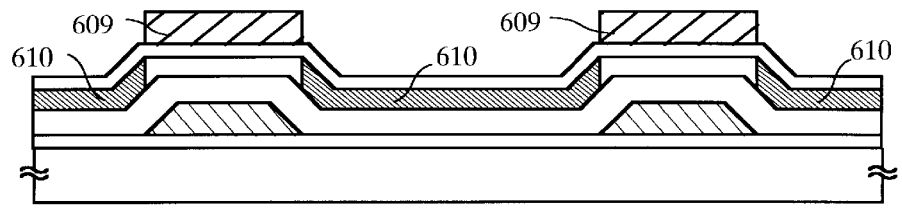
Figure 8C:
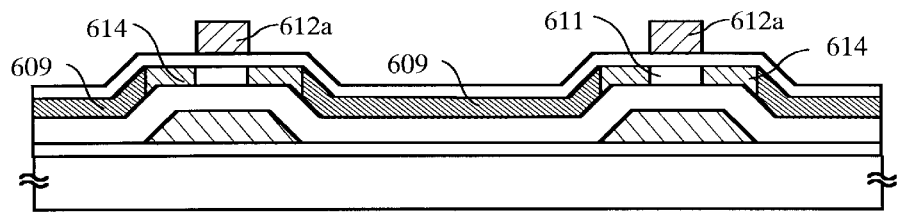

In this embodiment, an example in which a TFT having an LDD structure different from the embodiment 1 will be described with reference to FIGS. 8A to 8E and FIG. 9. This embodiment is the same as the embodiment 1 up to the step of FIG. 1C, and a drawing corresponding to FIG. 1C is shown in FIG. 8A. Reference numerals used in FIGS. 8A to 8E and FIG. 9 are the same as those of FIGS. 1A to 1E or FIG. 3. Besides, a top view of FIG. 9 is almost the same as FIG. 4A or 4B although the reference numerals are different.

One of the features of this embodiment is that a low concentration impurity region (n⁻-region) 614 is formed above a gate wiring line.

Since steps up to the state of FIG. 8A in this embodiment are the same as the embodiment 1, their explanation will be omitted.

Next, similarly to the embodiment 1, after a first mask 609 having almost the same shape as the gate wiring line is formed by exposure from the rear surface, an impurity is added to form a high concentration impurity region (n⁺-region) 610. A phosphorus element is also added in the first mask 609 (FIG. 8B).

Next, after the first mask 609 is patterned or removed, a second mask with a width smaller than the gate wiring line is formed, and then, an impurity is added to form a low concentration impurity region (n⁻-region) 614. In this embodiment, by using a normal patterning method, the second mask 612a with a width smaller than the gate wiring line was formed. In this way, an LDD structure is formed. Similarly, a phosphorus element is also added in the second mask (FIG. 8C).

As a method of forming the first mask 608 or the second mask 612a, a method of forming a resist mask by a normal patterning method, or a method of forming a resist mask by intentionally spreading and bending light from the rear surface toward the upper portion of the gate wiring line can be used.

Figure 8D:
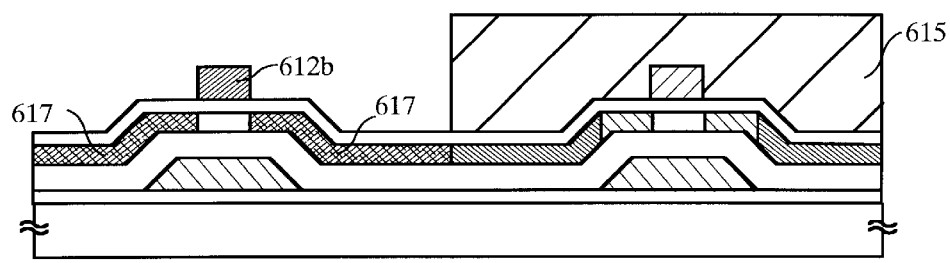
Figure 9:
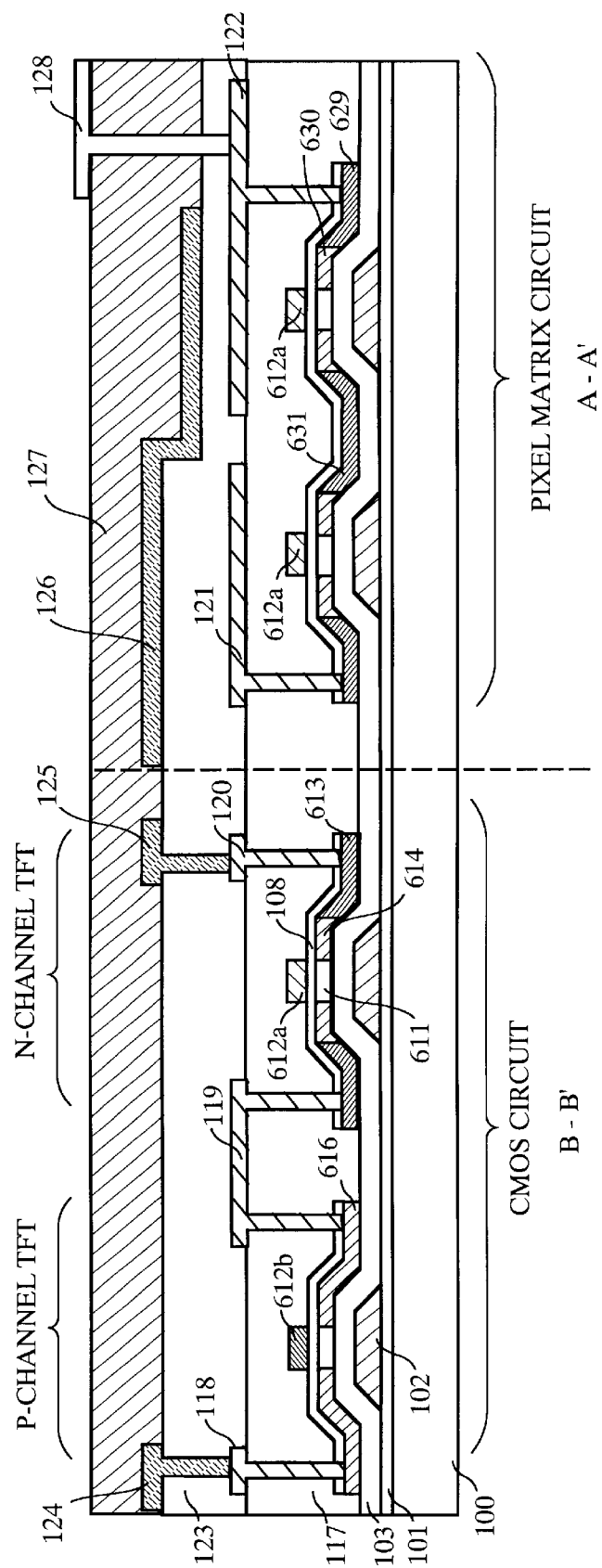
FIG. 9 is a sectional view showing an example of a structure of a semiconductor device (Embodiment 6)

Next, an N-channel TFT was covered with a third mask 615, and addition of a third impurity was carried out through the insulating film 105, so that a high concentration impurity region (P-type region) 617 was formed (FIG. 8D). In this embodiment, a boron element is used as an impurity to give P-type conductivity, and the dosage of boron is made such that the concentration of a boron ion of the P-type region becomes 1.3 to 2 times the concentration of a phosphorus ion added in the n⁺-type region. At this time, a boron ion is added and the second mask 612b contains the phosphorus element and boron element. Similarly, a boron element is also added in the third mask.

Besides, similarly to the embodiment 1, in the first to third impurity addition steps, since injection of an impurity is carried out from the upper portion of the insulating film 105, there is no fear that contaminants from the atmosphere, especially boron is mixed into an active layer. Thus, since the concentration of an impurity in the active layer can be controlled, fluctuation in threshold value can be suppressed.

When a person who carries out the invention suitably sets the patterns of the first to third masks, it is possible to relatively easily obtain the n⁻-type region, the n+-type region, the P-type region, and the channel formation region each having a desired width.

Incidentally, in the case where the first mask 609 and the second mask 612a are formed using a resist mask forming method by exposure from a rear surface, the LDD structure can be formed by a self-alignment manner, and the number of forming masks can be reduced, so that such a method is preferable.

Figure 8E:
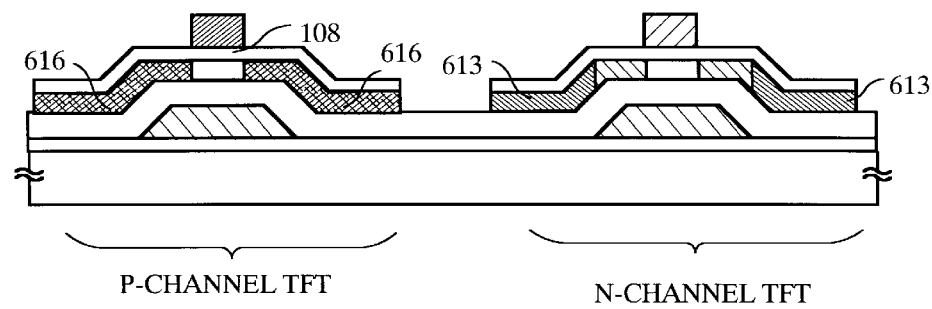

After the LDD structure in which the low concentration impurity region 614 overlapped the upper portion of the gate wiring line 102 was obtained in this way, only the third mask was removed, and patterning into a desired shape was carried out. A region 613 is an n⁺-type region, and a region 616 is a P-type region (FIG. 8E).

When subsequent steps are carried out in accordance with the embodiment 1, a semiconductor device obtained in FIG. 9 is completed.

In FIG. 9, since portions other than the portion of the active layer formed by making the low concentration impurity region overlap the upper portion of the gate wiring line are almost the same as FIG. 3, their explanation will be omitted.

The TFTs fabricated by carrying out this embodiment show electrical characteristics with less fluctuation. This embodiment can be combined with any one of the embodiments 1 to 5.

[Embodiment 7]

Figure 10A:
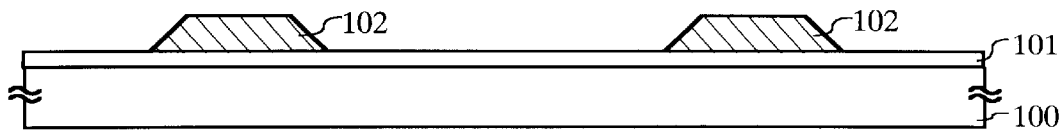
FIGS. 10A to 10C are views showing fabricating steps of TFTs (Embodiment 7)
Figure 10B:
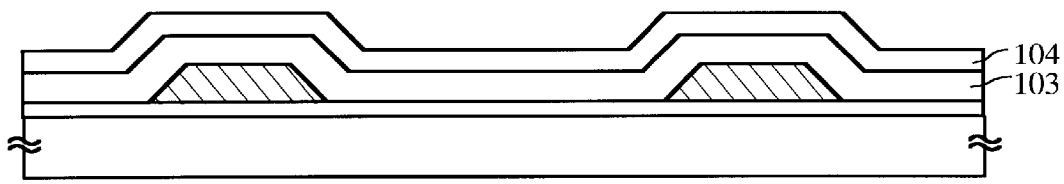
Figure 10C:
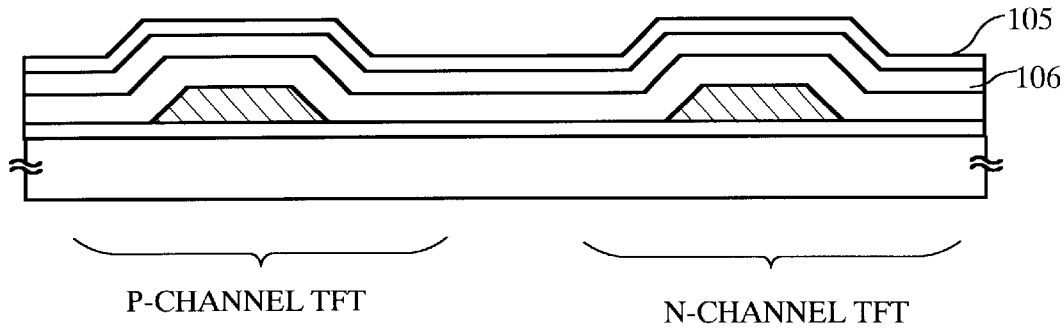

As shown in FIGS. 10A to 10C, this embodiment shows an example in which a protection film is formed by a method different from one in the embodiment 1.

The step shown in FIG. 10A corresponds to FIG. 1A of the embodiment 1. A different point between this embodiment and the embodiment 1 is that as shown in FIG. 10B, after a gate insulating film 103 and an initial semiconductor film 104 are continuously formed, in a laser crystallization step under the air, oxygen or oxidizing atmosphere, an oxide film is formed on a surface at the same time as formation of a crystalline semiconductor film. Also, in the step of FIG. 10B, such a structure may be adopted that before the initial semiconductor film is formed, contaminants on the film forming surface are reduced by active hydrogen or a hydrogen compound.

As shown in FIG. 10C, an oxide film 105 formed in the air, oxygen, or oxidizing atmosphere and under the laser condition above is used as a protection film. The laser irradiation condition is such that a pulse frequency is 150 Hz, an overlap ratio is 80 to 98%, in this embodiment, 96%, and a laser energy density is 100 to 500 mJ/cm$^2$, preferably 280 to 380 mJ/cm$^2$, in this embodiment, 350 mJ/cm$^2$. Incidentally, a person who carries out the invention may suitably determine the laser crystallization condition (wavelength of laser light, overlap ratio, irradiation intensity, pulse width, repetition frequency, irradiation time, etc.) in view of the film thickness of the initial semiconductor film 104, substrate temperature, and the like. This insulating film is suitable for an under film at the time of mask formation.

When subsequent steps are carried out in accordance with the embodiment 1, a semiconductor device is completed. This embodiment can be combined with any one of the embodiments 1 to 6.

[Embodiment 8]

This embodiment is an example in which a semiconductor device is fabricated by using an apparatus different from the embodiment 1.

In this embodiment, an apparatus including a first chamber exclusively used for formation of a gate insulating film and an insulating film and a second chamber exclusively used for formation of an initial semiconductor film is used, and movement is made through the respective chambers while high vacuum is kept, so that films are formed into a laminate.

In this embodiment, steps up to formation of a gate wiring line through preparation of a glass substrate as a substrate and formation of a silicon nitride oxide film (expressed as $SiO_xN_y$) as an under film are the same as the steps in the embodiment 1. Next, three layers (gate insulating film/initial semiconductor film/insulating film) are formed into a laminate.

First, after a gate insulating film made of a silicon nitride oxide film is formed in the first chamber, an initial semiconductor film is formed in the second chamber. An insulating film (protection film) made of a silicon nitride oxide film and being thinner than the gate insulating film is formed again in the first chamber. In this embodiment, contaminants on the film forming surface is reduced by active hydrogen or hydrogen compound before the initial semiconductor film is formed. When subsequent steps are carried out in accordance with the embodiment 1, a semiconductor device is completed. By using such an apparatus, as compared with the apparatus shown in FIG. 13, the number of chambers is reduced, and the apparatus equipment cost can be made low, so that productivity can be improved.

This embodiment can be combined with any one of the embodiments 1 to 7.

[Embodiment 9]

This embodiment is an example in which a semiconductor device is fabricated by using a mask different from the one in the embodiment 1. Since the basic structure is almost the same as the embodiment 1, a description will be made while paying attention to only different points.

In the embodiment 1, the same mask is used when a phosphorus element is added, so that such structure is made that addition is performed also in the source region and drain region of the P-channel TFT. However, in this embodiment, an adding step of a phosphorus element and an adding step of a boron element are carried out by using different masks. That is, at the adding step of the phosphorus element, the P-channel TFT is covered with a mask. Thus, unlike the embodiment 1, it is not necessary to add boron with a dosage which became 1.3 to 2 times the concentration of the phosphorus ion added in the n$^+$-type region, and it is possible to fabricate the P-channel TFT with excellent controllability.

This embodiment can be combined with any one of the embodiments 1 to 8.

[Embodiment 10]

Figure 11:
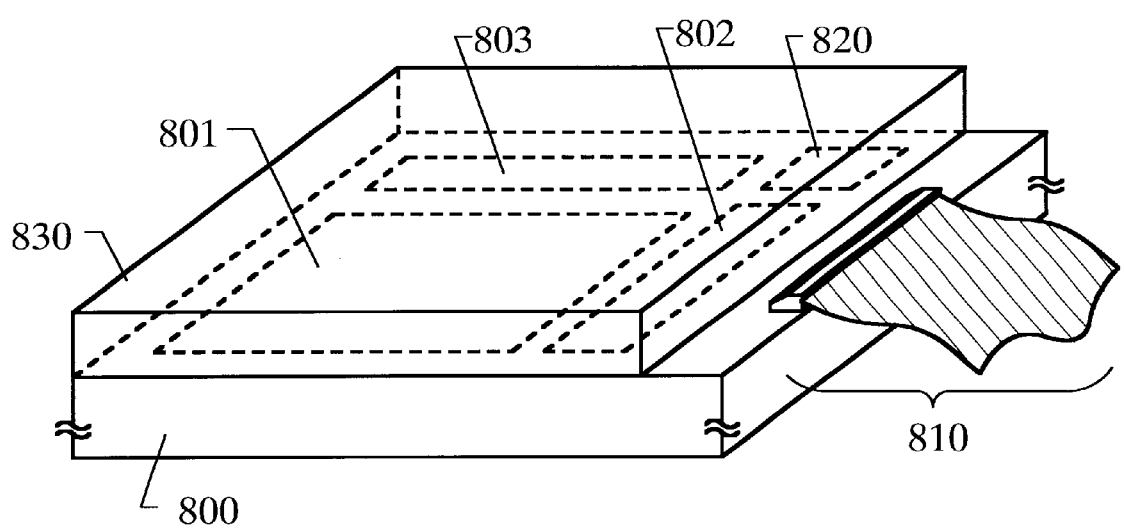
FIG. 11 is a view showing a structure of a semiconductor device (liquid crystal display device) (Embodiment 10)

In this embodiment, an example of a liquid crystal display device fabricated in accordance with the present invention will be shown in FIG. 11. Since well-known means may be used for a fabricating method of a pixel TFT (pixel switching element) and a cell assembling step, their detailed descriptions will be omitted.

In FIG. 11, reference numeral 800 designates a substrate (plastic substrate provided with a silicon oxide film) having an insulating surface, 801 designates a pixel matrix circuit, 802 designates a scanning line driver circuit, 803 designates a signal line driver circuit, 830 designates an opposite substrate, 810 designates an FPC (Flexible Printed Circuit), and 820 designates a logic circuit. As the logic circuit 820, a circuit for performing such processing that an IC has been conventionally substituted, such as a D/A converter, a γ-correction circuit, or a signal dividing circuit, can be formed. Of course, it is also possible to perform signal processing in an IC chip by providing the IC chip on the substrate.

Moreover, although the description has been made in this embodiment on the liquid crystal display device as an example, it is needless to say that the present invention can be applied to an EL (electroluminescence) display device or an EC (electrochromic) display device as long as the display device is an active matrix type.

Moreover, it does not matter if the liquid crystal display device fabricated by using the present invention is a transmission type or a reflection type. A person who carries out the invention can freely select any type. Like this, the present invention can be applied to any active matrix type electro-optical device (semiconductor device).

When the semiconductor device shown in this embodiment is fabricated, any structure of the embodiment 1 to embodiment 9 may be adopted, and the respective embodiments can be freely combined and used.

[Embodiment 11]

The present invention can be applied to all conventional IC techniques. That is, the present invention can be applied to all semiconductor circuits presently put on the market. For example, the present invention may be applied to a microprocessor such as a RISC processor integrated on one chip or an ASIC processor, and may be applied to a signal processing circuit typified by a driver circuit for a liquid crystal (D/A converter, γ-correction circuit, signal dividing circuit, etc.) or to a high frequency circuit for a portable equipment (portable telephone, PHS, mobile computer).

A semiconductor circuit such as a microprocessor is mounted on various electronic equipments, and functions as a central circuit. As typical electronic equipments, a personal computer, a portable information terminal equipment, and other all household electric appliances can be enumerated. Besides, a computer for controlling a vehicle (automobile, electric train, etc.) can also be enumerated. The present invention can also be applied to such a semiconductor device.

Incidentally, when the semiconductor device shown in this embodiment is fabricated, any structure of the embodiment 1 to embodiment 9 may be adopted, and the respective embodiments can be freely combined and used.

[Embodiment 12]

A CMOS circuit and a pixel matrix circuit formed through carrying out the present invention may be applied to various electro-optical devices (active matrix type liquid crystal displays, active matrix type EL displays, active matrix type EC displays). Namely, the present invention may be embodied in all the electronic equipments that incorporate those electro-optical devices as display media.

As such an electronic equipment, a video camera, a digital camera, a head-mount display (goggle-type display), a navigation system for vehicle, a personal computer, and a portable information terminal (a mobile computer, a portable telephone, or an electronic book) may be enumerated. Examples of those are shown in FIGS. 12A to 12F.

Figure 12A:
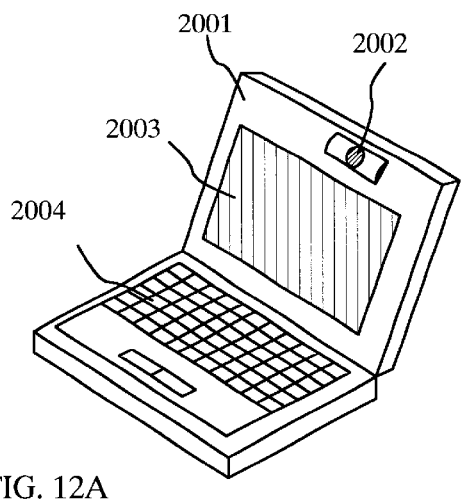
FIGS. 12A to 12F are views showing examples of semiconductor devices (electronic equipments) (Embodiment 12)

FIG. 12A shows a personal computer comprising a main body 2001, an image inputting unit 2002, a display device 2003, and a key board 2004. The present invention is applicable to the image inputting unit 2002, the display device 2003, and other signal control circuits.

Figure 12B:
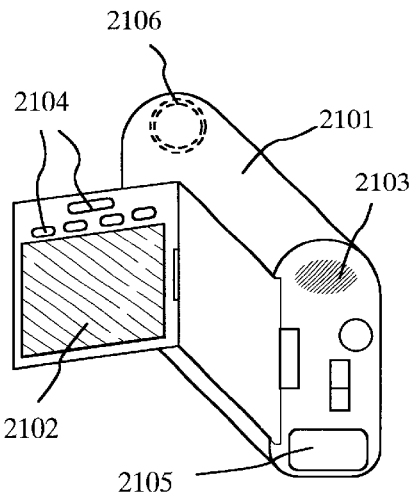

FIG. 12B shows a video camera comprising a main body 2101, a display device 2102, a voice input unit 2103, operation switches 2104, a battery 2105, and an image receiving unit 2106. The present invention is applicable to the display device 2102, the voice input unit 2103, and other signal control circuits.

Figure 12C:
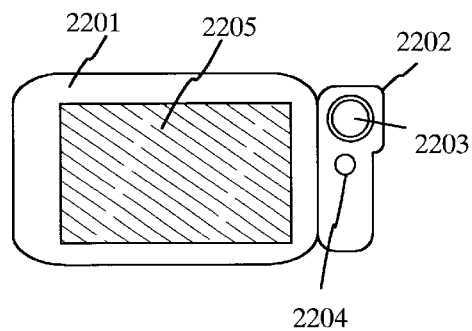

FIG. 12C shows a mobile computer comprising a main body 2201, a camera unit 2202, an image receiving unit 2203, an operation switch 2204, and a display device 2205. The present invention is applicable to the display device 2205 and other signal control circuits.

Figure 12D:
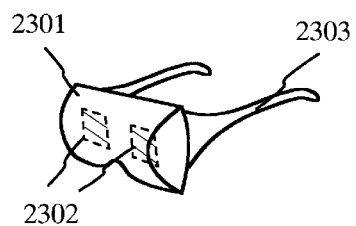

FIG. 12D shows a goggle-type display comprising a main body 2301, a display device 2302 and arm portions 2303. The present invention is applicable to the display device 2302 and other signal control circuits.

Figure 12E:
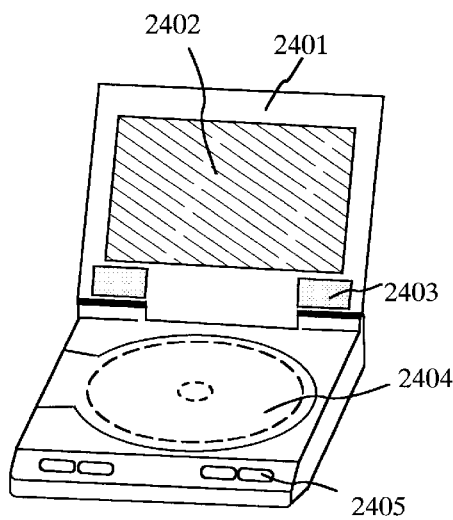

FIG. 12E shows a player that employs a recoding medium in which programs are recorded (hereinafter referred to as recording medium), and comprises a main body 2401, a display device 2402, a speaker unit 2403, a recording medium 2404, and an operation switch 2405. Incidentally, this player uses as the recoding medium a DVD (digital versatile disc), a CD and the like to serve as a tool for enjoying music or movies, for playing video games and for connecting to the Internet. The present invention is applicable to the display device 2402 and other signal control circuits.

Figure 12F:
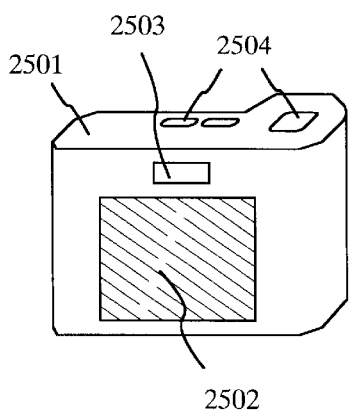

FIG. 12F shows a digital camera comprising a main body 2501, a display device 2502, an eye piece section 2503, operation switches 2504, and an image receiving unit (not shown). The present invention is applicable to the display device 2502 and other signal control circuits.

As described above, the present invention has so wide application range that it is applicable to electronic equipments in any fields. In addition, the electronic equipment of this embodiment may be realized with any construction obtained by combining The embodiments 1 to 10.

[Embodiment 13]

In the liquid crystal display device fabricated in the embodiment 10, other than a TN liquid crystal, various liquid crystals can be used. For example, it is possible to use a liquid crystal disclosed in "Characteristics and Driving Scheme of Polymer-Stabilized Monostable FLCD Exhibiting Fast Response Time and High Contrast Ratio with GrayScale Capability" by H. Furue et al., 1998, SID; "A Full-Color Thresholdless Antiferroelectric LCD Exhibiting Wide Viewing Angle with Fast Response Time" by T. Yoshida et al., 1997, SID DIGEST, 841; "Thresholdless antiferroelectricity in liquid crystals and its application to displays" by S. Inui et al., 1996, J. Mater. Chem. 6(4), 671–673; or U.S. Pat. No. 5,594,569.

A liquid crystal exhibiting antiferroelectricity in some temperature range is called an antiferroelectric liquid crystal. Of mixed liquid crystals including antiferroelectric liquid crystals, there is a thresholdless antiferroelectric mixed liquid crystal exhibiting electro-optical response characteristics in which transmittance is continuously changed with respect to an electric field. Some thresholdless antiferroelectric mixed liquid crystal exhibits V-shaped electro-optical response characteristics, and a liquid crystal in which its driving voltage is about ±2.5 V (cell thickness is about 1 $\mu$m to 2 $\mu$m) has also been found.

Figure 16:
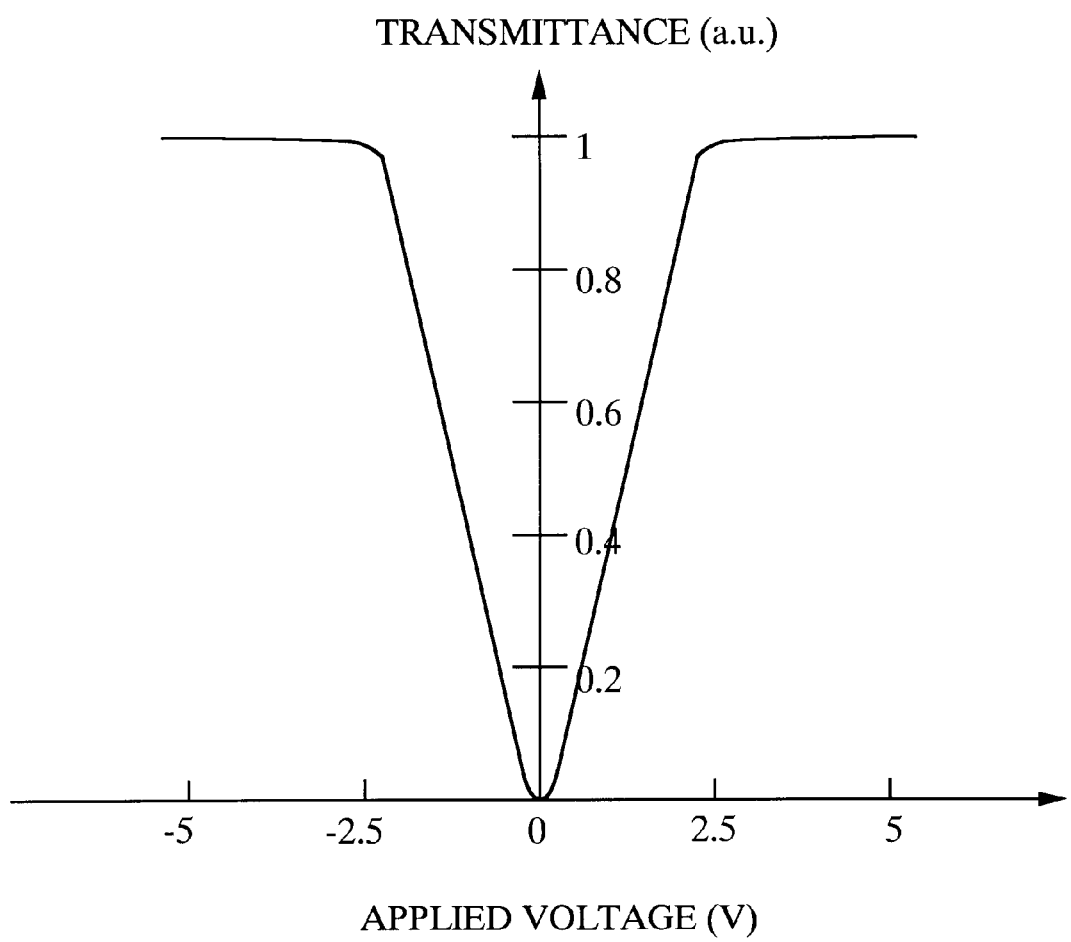
FIG. 16 is a view showing electro-optical response characteristics of thresholdless antiferroelectric liquid crystal (Embodiment 13).

Here, FIG. 16 shows an example of characteristics of light transmittance to applied voltage of the thresholdless antiferroelectric mixed liquid crystal showing the V-shaped electro-optical response. The vertical axis of the graph shown in FIG. 16 indicates the transmittance (in arbitrary unit) and the horizontal axis indicates the applied voltage. Incidentally, the transmission axis of a polarizing plate of a liquid crystal display device on the incident side is set almost parallel to a normal direction of a smectic layer of the thresholdless antiferroelectric mixed liquid crystal which is almost coincident with a rubbing direction of the liquid crystal display device. The transmission axis of the polarizing plate on the outgoing side is set almost normal (crossed Nicols) to the transmission axis of the polarizing plate on the incident side.

As shown in FIG. 16, it is understood that when such a thresholdless antiferroelectric mixed liquid crystal is used, low voltage driving and gradation display become possible.

In the case where such a low voltage driving thresholdless antiferroelectric mixed liquid crystal is used for a liquid crystal display device having an analog driver, it becomes possible to suppress the source voltage of a sampling circuit of an image signal to, for example, about 5 V to 8 V. Thus, the operation source voltage of the driver can be lowered, and low power consumption and high reliability of the liquid crystal display device can be realized.

Also in the case where such a low voltage driving thresholdless antiferroelectric mixed liquid crystal is used for a liquid crystal display device having a digital driver, an output voltage of a D/A conversion circuit can be lowered, so that the operation source voltage of the D/A conversion circuit can be lowered and the operation source voltage of the driver can be made low. Thus, low power consumption and high reliability of the liquid crystal display device can be realized.

Thus, to use such a low voltage driving thresholdless antiferroelectric mixed liquid crystal is effective also in the case where a TFT having an LDD region (low concentration impurity region) with a relatively small width (for example, 0 nm to 500 nm or 0 nm to 200 nm) is used.

In general, the thresholdless antiferroelectric mixed liquid crystal has large spontaneous polarization, and the dielectric constant of the liquid crystal itself is high. Thus, in the case where the thresholdless antiferroelectric mixed liquid crystal is used for a liquid crystal display device, it becomes necessary to provide relatively large holding capacitance for a pixel. Thus, it is preferable to use the thresholdless antiferroelectric mixed liquid crystal having small spontaneous polarization. It is also permissible to design such that a driving method of the liquid crystal display device is made linear sequential driving, so that a writing period (pixel feed period) of a gradation voltage to a pixel is prolonged and small holding capacitance is compensated.

Since low voltage driving can be realized by using such a thresholdless antiferroelectric mixed liquid crystal, low power consumption of the liquid crystal display device can be realized.

Incidentally, as long as a liquid crystal has electro-optical characteristics as shown in FIG. 16, any liquid crystal can be used as a display medium of a liquid crystal display device of the present invention.

[Embodiment 14]

A CMOS circuit and a pixel matrix circuit formed through carrying out the present invention may be applied to various electro-optical devices.

Enumerated as such an electronic equipment is a projector (a rear-type projector or a front-type projector), an example of which is shown in FIGS. 15A to 15D.

Figure 15A:
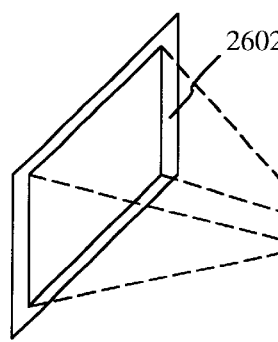
FIGS. 15A to 15D are views showing semiconductor devices (electronic equipments) (Embodiment 14)

FIG. 15A shows a front-type projector comprising a display device 2601 and a screen 2602. The present invention is applicable to the display device and other signal control circuits.

Figure 15B:
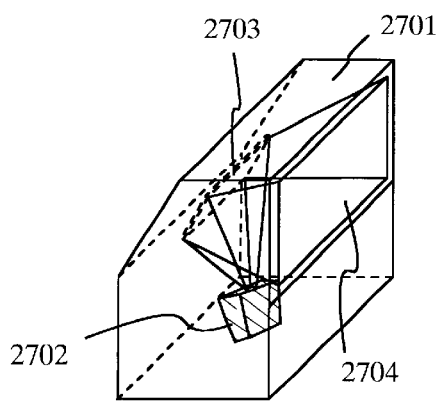

FIG. 15B shows a rear-type projector comprising a main body 2701, a display device 2702, a mirror 2703, and a screen 2704. The present invention is applicable to the display device and other signal control circuits.

Figure 15C:
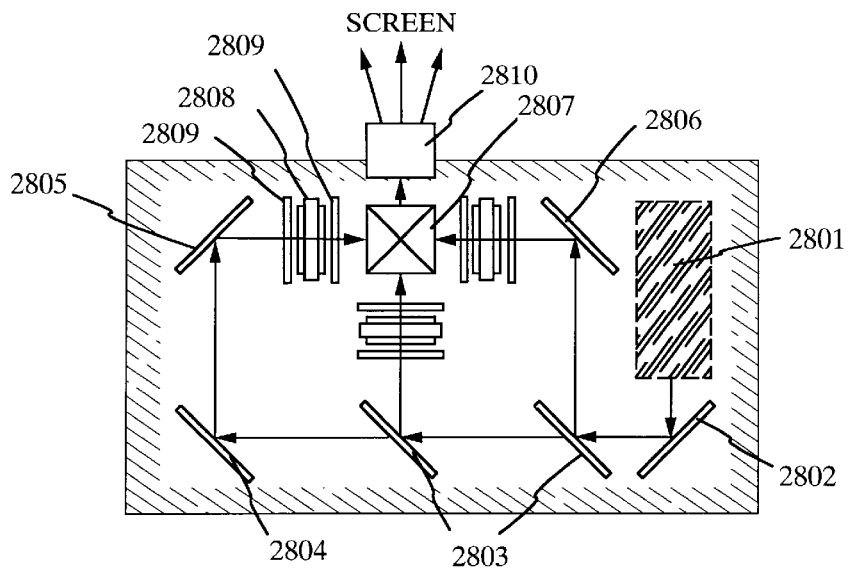

FIG. 15C is a diagram showing an example of the structure of the display devices 2601 and 2702 in FIGS. 15A and 15B. The display device 2601 or 2702 comprises a light source optical system 2801, mirrors 2802 and 2804 to 2806, dichroic mirrors 2803, a prism 2807, liquid crystal display devices 2808, phase difference plates 2809, and a projection optical system 2810. The projection optical system 2810 consists of an optical system provided with a projection lens. This embodiment shows an example of "three plate type", but not particularly limited thereto. For instance, the invention may be applied also to "single plate type". Further, in the light path indicated by an arrow in FIG. 15C, an optical system such as an optical lens, a film having a polarization function, a film for adjusting a phase difference, an IR film may be provided on discretion of a person who carries out the invention.

Figure 15D:
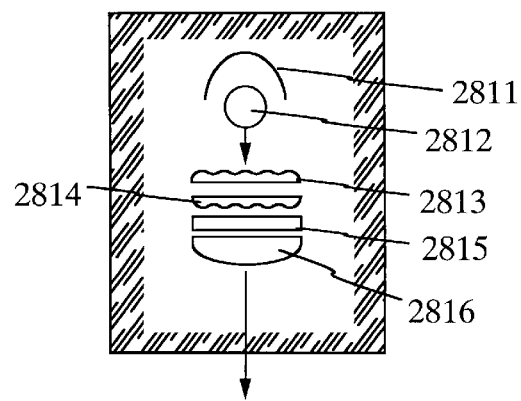

FIG. 15D is a diagram showing an example of the structure of the light source optical system 2801 in FIG. 15C. In this embodiment, the light source optical system 2801 comprises a reflector 2811, light sources 2812, 2813 and 2814, a polarization conversion element 2815, and a condenser lens 2816. The light source optical system shown in FIG. 15D is an example thereof, and is not particularly limited. For instance, on discretion of a person who carries out the invention, the light source optical system may be provided with an optical system such as an optical lens, a film having a polarization function, a film for adjusting the phase difference and IR film.

As described above, the present invention has so wide application range that it is applicable to electronic equipments in any fields. In addition, the electronic equipment of this embodiment may be realized with any construction obtained by combining The embodiments 1 to 10, and 13.

The present invention has the following effects.

By carrying out the present invention using the apparatus shown in FIG. 13, steps are ended without exposing an interface (at a main surface side or rear surface side) of an active layer of a TFT to the atmosphere, so that a very clean interface can be realized.

By such a structure, especially an interface between an active layer and a gate insulating film which affects electric characteristics of a TFT can be made clean, so that TFTs having excellent electrical characteristics with less fluctuation can be realized.

Figure 14:
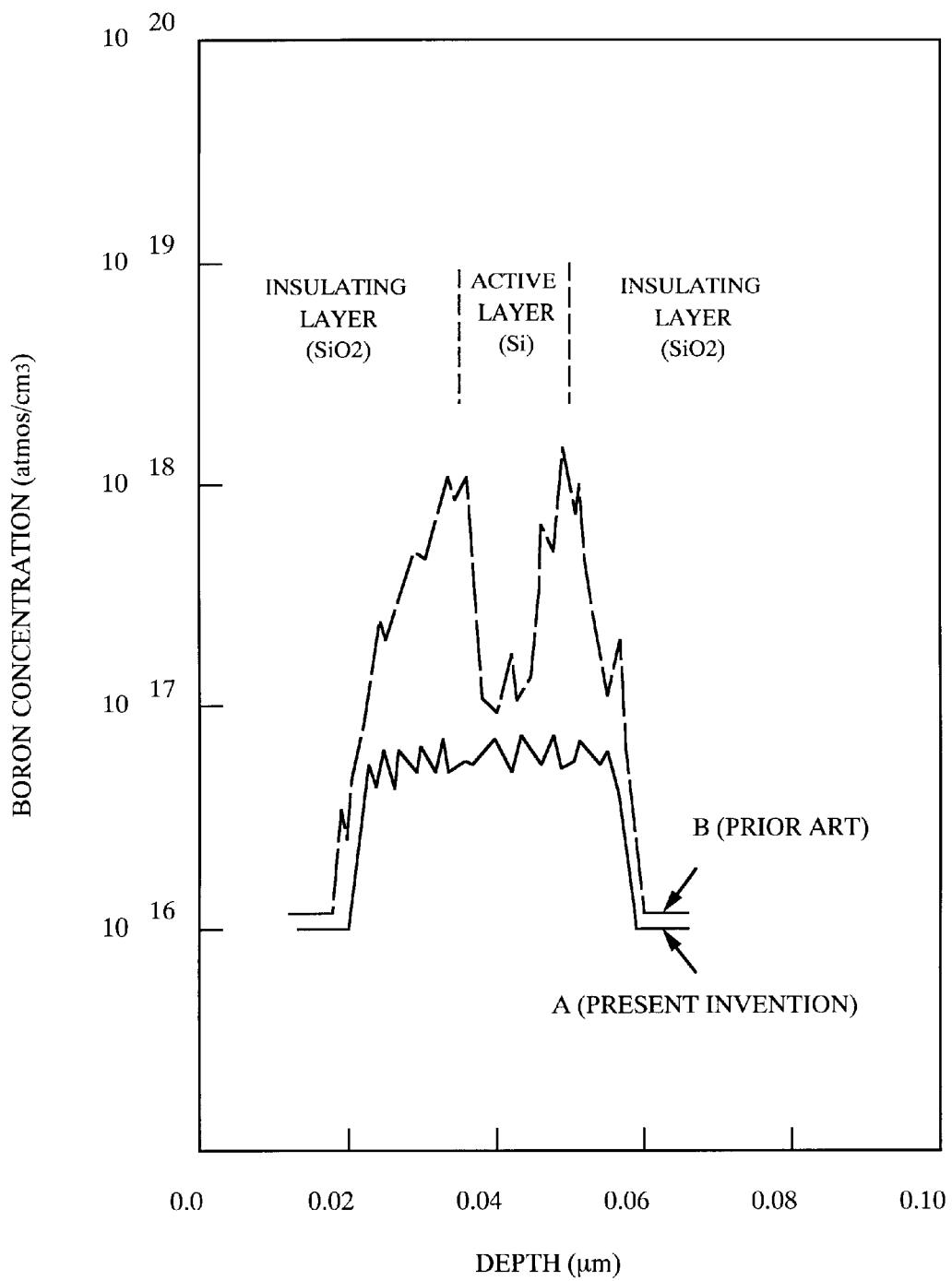
FIG. 14 is a view showing a boron concentration profile by SIMS analysis (an example of comparison between prior art and the present invention)

Besides, since mixture of contaminants contained in the atmosphere, especially boron is prevented by a protection film, and an impurity to give conductivity is added through this protection film, so that accurate threshold value control can be realized. Conventionally, in the case where the SIMS analysis is carried out, an interface (at a main surface side or rear surface side) of an active layer (channel formation region) of a TFT has a concentration peak (indicated by broken line B in FIG. 14) of boron and the peak value is $1 \times 10^{18}$ atoms/cm$^3$ or more. However, an interface (at a main surface side or rear surface side) of an active layer (channel formation region) of a TFT fabricated by using the present invention has no concentration peak of boron, but shows an almost uniform concentration profile (solid line A in FIG. 14), and it is possible to realize that the maximum value of boron concentration is made $3 \times 10^{17}$ atoms/cm$^3$ or less, preferably $1 \times 10^{17}$ atoms/cm$^3$ or less. Besides, it is possible to realize that the concentration of oxygen in the active layer (channel formation region) is made $2 \times 10^{19}$ atoms/cm$^3$ or less, the concentration of carbon is made $5 \times 10_{18}$ atoms/cm$^3$ or less, and the concentration of nitrogen is made $5 \times 10^{18}$ atoms/cm$^3$ or less. Besides, it is possible to realize that the concentration of sodium in the active layer (channel formation region) is made $3 \times 10_{16}$ atoms/cm$^3$ or less.

At this time, it is possible to realize that a threshold voltage as a typical parameter of a TFT is −0.5 to 2 V for an N-channel TFT and 0.5 to −2 V for a P-channel TFT. Besides, it is possible to realize that a subthreshold coefficient (S value) is 0.1 to 0.3 V/decade.

Besides, as shown in the above embodiments, it is possible to obtain a TFT provided with an LDD structure having high reproducibility, improved stability in the TFT, and high productivity. By using the present invention, a mask used for formation of an LDD structure is used as it is as a light shielding film, and it is possible to realize that an active layer, especially a channel formation region is protected against deterioration by light and reliability can be improved. Besides, by omitting a removing step of a mask, manufacture of a TFT in a short time has been made possible. In addition, since the mask functions as an insulating film at a crossing portion of a gate wiring line and other wiring lines, it is possible to realize reduction of interwiring capacitance and improvement of the electric characteristics of a TFT.

What is claimed is:

1. A semiconductor device comprising:
   a gate wiring on an insulating surface;
   a gate insulating film being in contact with the gate wiring;
   an active layer being in contact with an upper surface of the gate insulating film and including a source region, a drain region, and a channel forming region formed between the source and drain regions;
   a protection film being in contact with an upper surface of the active layer; and
   an organic resin being in contact with the protection film and including a trivalent or pentavalent impurity element;
   wherein the protection film covers at least a portion of the active layer.

2. A device according to claim 1, wherein the trivalent or pentavalent impurity element is boron or phosphorus, respectively.

3. A device according to claim 1, wherein the organic resin has photosensitivity.

4. A device according to claim 1, wherein the organic resin has a light shielding property.

5. A device according to claim 1, wherein the protection film is formed by irradiating with an infrared light or an ultraviolet light to an initial semiconductor film.

6. A device according to claim 1, wherein the active layer is a crystalline semiconductor film formed by crystallizing an initial semiconductor film by irradiating with an infrared light or an ultraviolet light through the protection film.

7. A device according to claim 6, wherein the gate insulating film, the initial semiconductor film, and the protection film are formed through a sequential laminate formation step without exposure to an atmosphere.

8. A device according to claim 1, wherein a concentration of a trivalent or pentavalent impurity in the organic resin is $1 \times 10^{19}$ atoms/cm$^3$ or more.

9. A device according to claim 1, wherein a concentration of boron in a semiconductor film at an interface between the gate insulating film and the channel forming region or at an interface between the protection film and the channel forming region is $3 \times 10^{17}$ atoms/cm$^3$ or less.

10. A device according to claim 1, wherein a concentration of oxygen in a semiconductor film at an interface between the gate insulating film and the channel forming region or at an interface between the protection film and the channel forming region is $2 \times 10^{19}$ atoms/cm$^3$ or less.

11. A device according to claim 1, wherein a concentration of carbon or nitrogen in a semiconductor film at an interface between the gate insulating film and the channel forming region or at an interface between the protection film and the channel forming region is $5 \times 10^{18}$ atoms/cm$^3$ or less.

12. A device according to claim 1,
wherein the gate wiring has a single layer structure or a laminate structure, and
wherein the gate wiring has a film includes at least one selected from the group consisting of aluminum, tantalum, molybdenum, titanium, chromium and silicon, or a silicon film added with a P-type or N-type impurity.

13. A device according to claim 1, wherein the protection film has a thickness in a range of 5 to 50 nm.

14. A device according to claim 1, wherein the semiconductor device is one selected from the group consisting of a microprocessor, a signal processing circuit, and a high frequency circuit.

15. A device according to claim 1, wherein the semiconductor device is an electro-optical device or an electronic equipment.

16. A device according to claim 15, wherein the electro-optical device is one selected from the group consisting of a liquid crystal display device, an EL display device, an EC display device, and an image sensor.

17. A device according to claim 15, wherein the electronic equipment is one selected from the group consisting of a video camera, a digital camera, a projector, a goggle display, a navigation system for vehicles, a personal computer, and a portable information terminal.

18. A method of fabricating a semiconductor device, said method comprising the steps of:
forming a gate wiring on an insulating surface;
forming a gate insulating film and an initial semiconductor film into a laminate sequentially without exposing them to an atmosphere on the gate wiring;
irradiating the initial semiconductor film with an infrared light or an ultraviolet light to crystallize the initial semiconductor film into a crystalline semiconductor film and to form an oxide film at a same time;
covering a first portion of the crystalline semiconductor film with a mask;
providing a trivalent or pentavalent impurity element into second portions of the crystalline semiconductor film through the oxide film,
wherein the first portion of the crystalline semiconductor film is a channel forming region while the second portions of the crystalline semiconductor film are source and drain regions.

19. A method of fabricating a semiconductor device, said method comprising the steps of:
forming a gate wiring on an insulating surface;
forming a gate insulating film, an initial semiconductor film, and an insulating film into a laminate sequentially without exposing them to an atmosphere on the gate wiring;
irradiating the initial semiconductor film with an infrared light or an ultraviolet light to crystallize the initial semiconductor film into a crystalline semiconductor film;
covering a first portion of the crystalline semiconductor film with a mask;
providing a trivalent or pentavalent impurity element into second portions of the crystalline semiconductor film through said insulating film,
wherein the first portion of the crystalline semiconductor film is a channel forming region while the second portions of the crystalline semiconductor film are source and drain regions.

20. A method according to claim 19, wherein the gate insulating film, the initial semiconductor film, and the insulating film are formed in different chambers from one another.

21. A method according to claim 19, wherein said gate insulating film, said initial semiconductor film, and said protection film are formed in a same chamber.

22. A method according to claim 19,
wherein the gate insulating film and the insulating film are formed in a first chamber, and
wherein the initial semiconductor film is formed in a second chamber.

23. A method according to claim 18, wherein contaminants on a surface of the gate insulating film are reduced by active hydrogen or hydrogen compound before forming the initial semiconductor film.

24. A method according to claim 18, further comprising a step of forming a silicon nitride film before forming the gate insulating film.

25. A method according to claims 18, further comprising a step of forming a laminate film including BCB (benzocyclobutene) as a part of the gate insulating film.

26. A method according to claim 19, wherein contaminants on a surface of the gate insulating film are reduced by active hydrogen or hydrogen compound before forming the initial semiconductor film.

27. A method according to claim 19, further comprising a step of forming a silicon nitride film before forming the gate insulating film.

28. A method according to claims 19, further comprising a step of forming a laminate film including BCB (benzocyclobutene) as a part of the gate insulating film.

* * * * *